United States Patent
Kudo

(10) Patent No.: US 10,427,443 B2
(45) Date of Patent: Oct. 1, 2019

(54) LITHOGRAPHIC PRINTING PLATE PRECURSOR, METHOD OF PREPARING LITHOGRAPHIC PRINTING PLATE, AND LITHOGRAPHIC PRINTING METHOD

(71) Applicant: FUJIFILM CORPORATION, Minato-ku, Tokyo (JP)

(72) Inventor: Kotaro Kudo, Shizuoka (JP)

(73) Assignee: FUJIFILM CORPORATION, Tokyo (JP)

(*) Notice: Subject to any disclaimer, the term of this patent is extended or adjusted under 35 U.S.C. 154(b) by 0 days.

(21) Appl. No.: 16/382,196

(22) Filed: Apr. 12, 2019

(65) Prior Publication Data
US 2019/0232703 A1    Aug. 1, 2019

Related U.S. Application Data

(63) Continuation of application No. PCT/JP2018/021024, filed on May 31, 2018.

(30) Foreign Application Priority Data

Sep. 29, 2017 (JP) ................. 2017-190837
Mar. 30, 2018 (JP) ................. 2018-069152

(51) Int. Cl.
    *B41N 1/08* (2006.01)
    *B41M 1/06* (2006.01)
    (Continued)

(52) U.S. Cl.
    CPC ............ *B41N 1/083* (2013.01); *B41C 1/1016* (2013.01); *B41F 3/32* (2013.01); *B41M 1/06* (2013.01)

(58) Field of Classification Search
    None
    See application file for complete search history.

(56) References Cited

U.S. PATENT DOCUMENTS

2003/0000409 A1    1/2003  Blake et al.

FOREIGN PATENT DOCUMENTS

JP    2001-315451 A    11/2001
JP    2006-078900 A    3/2006
(Continued)

OTHER PUBLICATIONS

International Search Report issued in International Application No. PCT/JP2018/021024 dated Jul. 31, 2018.
(Continued)

*Primary Examiner* — Joshua D Zimmerman
(74) *Attorney, Agent, or Firm* — SOLARIS Intellectual Property Group, PLLC

(57) ABSTRACT

Provided are a lithographic printing plate precursor including an aluminum support, and an image recording layer on the aluminum support, in which the aluminum support includes an anodized film on a surface of the image recording layer side, the anodized film has micropores extending in a depth direction from the surface of the anodized film on the image recording layer side, an average pore diameter of the micropores in the surface of the anodized film is greater than 0 μm and 0.03 μm or less, an average maximum diameter of the micropores inside the anodized film is in a range of 0.04 μm to 0.30 μm, an average value A nm of thicknesses of surface opening portions and an average value B nm of thicknesses of internal maximum diameter portions satisfy a relationship of 2.5≤B/A≤28.0, and the image recording layer contains an acid color former; a method of preparing a lithographic printing plate using the lithographic printing plate precursor; and a lithographic printing method.

19 Claims, 5 Drawing Sheets

(51) Int. Cl.
  *B41C 1/10*    (2006.01)
  *B41F 3/32*    (2006.01)

(56) References Cited

FOREIGN PATENT DOCUMENTS

JP    2011-068006 A    4/2011
JP    2016-179592 A    10/2016

OTHER PUBLICATIONS

Written Opinion of the ISA issued in International Application No. PCT/JP2018/021024 dated Jul. 31, 2018.

LITHOGRAPHIC PRINTING PLATE PRECURSOR, METHOD OF PREPARING LITHOGRAPHIC PRINTING PLATE, AND LITHOGRAPHIC PRINTING METHOD

CROSS-REFERENCE TO RELATED APPLICATIONS

This application is a Continuation of International Application No. PCT/JP2018/021024 filed on May 31, 2018, which claims priority to Japanese Patent Application No. 2017-190837 filed on Sep. 29, 2017, and Japanese Patent Application No. 2018-069152 filed on Mar. 30, 2018. The entire contents of these applications are incorporated herein by reference.

BACKGROUND OF THE INVENTION

1. Field of the Invention

The present disclosure relates to a lithographic printing plate precursor, a method of preparing a lithographic printing plate, and a lithographic printing method.

2. Description of the Related Art

In a lithographic printing plate precursor that includes an aluminum support and an image recording layer, formation of an anodized film on a surface of the aluminum support on a side of the image recording layer has been examined in order to suppress dissolution of the aluminum support.

JP2011-068006A describes a lithographic printing plate precursor including a support; and an image recording layer that includes (A) sensitizing dye, (B) polymerization initiator, (C) polymerizable compound, and (D) polymer on the support, in which the image recording layer on an unexposed portion is removed by printing ink and/or dampening water, and the support is prepared using an aluminum alloy plate in which the density of an intermetallic compound having an equivalent circle diameter of 0.2 µm or greater in the surface is 35000 pcs/mm$^2$ or greater.

SUMMARY OF THE INVENTION

Further, as a pre-treatment of attaching a lithographic printing plate to a printing press, an operation (inspection) of inspecting and identifying an image on a lithographic printing plate is performed on a lithographic printing plate precursor in order to verify whether an image is recorded on the lithographic printing plate in an intended manner. Further, in multicolor printing, it is important in printing work whether it is possible to determine that a register mark serving as a registering mark is drawn.

Particularly, since development has not been made at the stage of attaching a lithographic printing plate precursor to a printing press in a case of an on-press development type lithographic printing plate precursor on which a typical development treatment is not performed, it is difficult to confirm an image on the lithographic printing plate precursor and thus the image cannot be sufficiently inspected in some cases.

The on-press development is a method of image-exposing a lithographic printing plate precursor, attaching the lithographic printing plate precursor to a printing press without performing a development treatment of the related art thereon, and removing a non-image area of an image recording layer at the initial stage of a typical printing step.

For these reasons, in a lithographic printing plate precursor, means for confirming an image at a stage after the exposure, in other words, formation of a so-called print-out image by coloring or decoloring an exposed region has been examined.

As the means for forming a print-out image, means for allowing an image recording layer to contain an acid color former has been examined.

However, the present inventors found that unintended coloring (also referred to as "appearance failure") may occur with time in a case where an aluminum support on which an anodized film is formed is used for a lithographic printing plate precursor and even in a case where an image recording layer contains an acid color former or is not exposed.

An object of the present invention is to provide a lithographic printing plate precursor that suppresses occurrence of appearance failure, a method of preparing a lithographic printing plate obtained by using the lithographic printing plate precursor; and a lithographic printing method.

The means for solving the above-described problems includes the following aspects.

<1> A lithographic printing plate precursor comprising: an aluminum support; and an image recording layer on the aluminum support, in which the aluminum support includes an anodized film on a surface of the image recording layer side, the anodized film has micropores extending in a depth direction from the surface of the anodized film on the image recording layer side, an average pore diameter of the micropores in the surface of the anodized film is greater than 0 µm and 0.03 µm or less, an average maximum diameter of the micropores inside the anodized film is in a range of 0.04 µm to 0.30 µm, an average value A nm of thicknesses of surface opening portions starting from the surface of the anodized film and having a pore diameter inside the anodized film of greater than 0 µm and 0.03 µm or less and an average value B nm of thicknesses of internal maximum diameter portions in which pore diameters of the micropores inside the anodized film are in a range of 0.04 µm to 0.30 µm satisfy a relationship of 2.5≤B/A≤28.0, the average value B of thicknesses of the internal maximum diameter portions is in a range of 500 nm to 2800 nm, and the image recording layer contains an acid color former.

<2> The lithographic printing plate precursor according to <1>, in which the average value A of the thicknesses of the surface opening portions is in a range of 10 nm to 200 nm.

<3> A lithographic printing plate precursor comprising: an aluminum support; and an image recording layer on the aluminum support, in which the aluminum support includes an anodized film on a surface of the image recording layer side, the anodized film has micropores extending in a depth direction from the surface of the anodized film on the image recording layer side, the micropores include at least large-diameter pores whose maximum diameter inside the anodized film is in a range of 0.01 µm to 0.30 µm, an average pore diameter of the micropores in the surface of the anodized film is 90% or less of the maximum diameter of the micropores inside the anodized film, a thickness of the anodized film is in a range of 550 nm to 2850 nm, and the image recording layer contains an acid color former.

<4> The lithographic printing plate precursor according to <3>, in which the micropores are micropores which further include small-diameter pores communicating with a bottom of the large-diameter pores, extending in the depth direction from a communication position, and having an average pore diameter of 0.01 µm or less and in which the pore diameters of the small-diameter pores in the communication position are smaller than the pore diameters of the large-diameter pores in the communication position.

<5> The lithographic printing plate precursor according to <3> or <4>, in which an average value of depths of the large-diameter pores to the bottom from the surface of the anodized film is in a range of 5 nm to 400 nm.

<6> The lithographic printing plate precursor according to any one of <1> to <5>, in which the acid color former is a leuco dye.

<7> The lithographic printing plate precursor according to any one of <1> to <6>, in which the image recording layer further contains an acid generator.

<8> The lithographic printing plate precursor according to <7>, in which the acid generator contains an organic borate compound.

<9> The lithographic printing plate precursor according to any one of <1> to <8>, in which a value of a brightness L* in an L*a*b* color system of the surface of the anodized film on the image recording layer side is in a range of 70 to 100.

<10> The lithographic printing plate precursor according to any one of <1> to <8>, in which a value of a brightness L* in an L*a*b* color system of the surface of the anodized film on the image recording layer side is in a range of 72 to 90.

<11> The lithographic printing plate precursor according to any one of <1> to <10>, in which a steepness a45 representing an area ratio of a portion having an inclining degree of 45° or greater obtained by extracting a component with a wavelength of 0.2 μm to 2 μm in the surface of the anodized film on the image recording layer side in a frequency distribution based on fast Fourier transformation of three-dimensional data obtained by performing measurement using an atomic force microscope is 30% or less.

<12> The lithographic printing plate precursor according to any one of <1> to <11>, in which an amount of the image recording layer is in a range of 0.5 g/m² to 2.5 g/m².

<13> The lithographic printing plate precursor according to any one of <1> to <12>, in which a thickness X μm of the anodized film and a total amount Y g/m² of all layers formed on the aluminum support satisfy a relationship of Expression 1.

$$Y \geq -1.19X + 2.6 \quad \text{Expression 1}$$

<14> The lithographic printing plate precursor according to any one of <1> to <13>, in which the image recording layer contains thermoplastic polymer particles, and the thermoplastic polymer particles are formed of a copolymer of a styrene-(meth)acrylonitrile-poly(ethylene glycol)monoalkyl ether (meth)acrylate compound.

<15> The lithographic printing plate precursor according to any one of <1> to <14>, in which an overcoat layer containing a water-soluble polymer is provided on the image recording layer.

<16> The lithographic printing plate precursor according to <15>, in which the overcoat layer contains hydroxyalkyl cellulose.

<17> The lithographic printing plate precursor according to any one of <1> to <16>, which is a lithographic printing plate precursor for on-press development.

<18> A method of preparing a lithographic printing plate, comprising: a step of imagewise-exposing the lithographic printing plate precursor according to any one of <1> to <17>; and a step of supplying at least any of printing ink or dampening water and removing an image recording layer in a non-image area on a printing press.

<19> A lithographic printing method comprising: a step of imagewise-exposing the lithographic printing plate precursor according to any one of <1> to <18>; a step of supplying at least any of printing ink or dampening water and removing a non-image area of an image recording layer on a printing press to prepare a lithographic printing plate; and a step of performing printing using the obtained lithographic printing plate.

According to the embodiment of the present invention, it is possible to provide a lithographic printing plate precursor that suppresses occurrence of appearance failure, a method of preparing a lithographic printing plate obtained by using the lithographic printing plate precursor; and a lithographic printing method.

DESCRIPTION OF THE PREFERRED EMBODIMENTS

Figure 1:
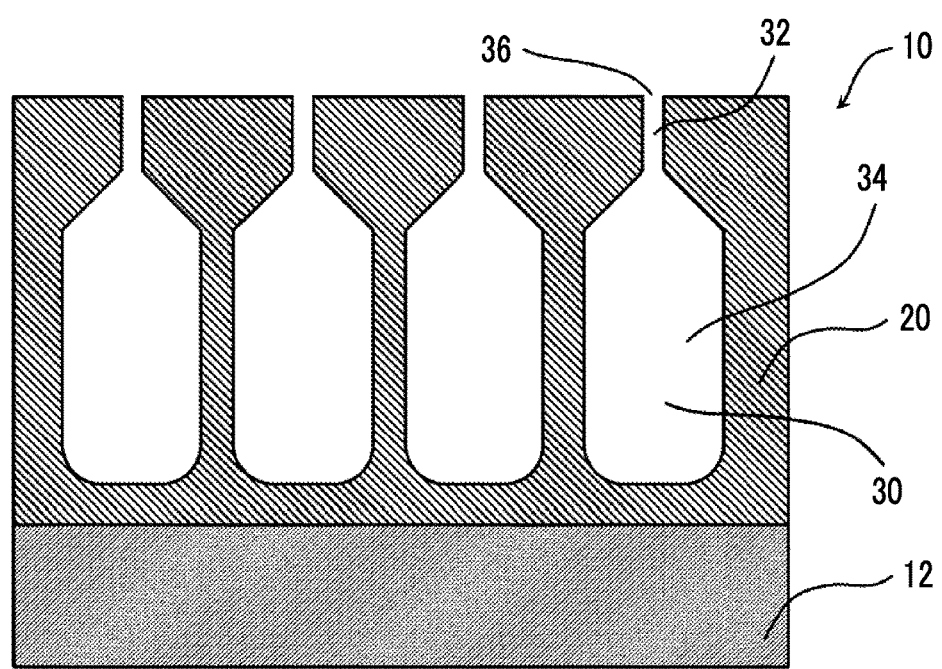
FIG. 1 is a schematic cross-sectional view illustrating an example of an aluminum support according to the present disclosure.

Hereinafter, the contents of the present disclosure will be described in detail. The description of constituent elements below is made based on representative embodiments of the present disclosure in some cases, but the present disclosure is not limited to such embodiments.

Further, in the present specification, the numerical ranges shown using "to" indicate ranges including the numerical values described before and after "to" as the lower limits and the upper limits.

In the present specification, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both of acryl and methacryl, and the concept of "(meth)acryloyl" includes both of acryloyl and methacryloyl.

In the present specification, in a case where substitution or unsubstitution is not noted in regard to the notation of a group in a compound represented by a formula, and the group may further include a substituent, the group includes not only an unsubstituted group but also a substituent unless otherwise specified. For example, in a chemical structural formula, the description "R represents an alkyl group, an aryl group, or a heterocyclic group" means "R represents an unsubstituted alkyl group, a substituted alkyl group, an unsubstituted aryl group, a substituted aryl group, an unsubstituted heterocyclic group, or a substituted heterocyclic group".

Further, the term "step" in the present specification indicates not only an independent step but also a step which cannot be clearly distinguished from other steps as long as the intended purpose of the step is achieved. Further, in the present disclosure, "% by mass" has the same definition as that for "% by weight", and "part by mass" has the same definition as that for "part by weight".

Further, in the present disclosure, a combination of two or more preferred aspects is a more preferred aspect.

Further, the weight-average molecular weight (Mw) and the number average molecular weight (Mn) in the present disclosure are molecular weights in terms of polystyrene used as a standard substance, which are detected by using a solvent tetrahydrofuran (THF), a differential refractometer, and a gel permeation chromatography (GPC) analyzer using TSKgel GMENL, TSKgel G4000HxL, and TSKgel G2000HxL (all trade names, manufactured by Tosoh Corporation) as columns, unless otherwise specified.

In the present specification, the term "lithographic printing plate precursor" includes not only a lithographic printing plate precursor but also a key plate precursor. Further, the term "lithographic printing plate" includes not only a lithographic printing plate prepared by performing operations such as exposure and development on a lithographic printing plate precursor as necessary but also a key plate. In a case of a key plate precursor, the operations of exposure, development, and the like are not necessarily required. Further, a key plate is a lithographic printing plate precursor for attachment to a plate cylinder that is not used in a case where printing is performed on a part of a paper surface with one or two colors in color newspaper printing.

Hereinafter, the present disclosure will be described in detail.

(Lithographic Printing Plate Precursor)

According to a first aspect (hereinafter, also referred to as an "aspect A") of a lithographic printing plate precursor of the present disclosure, the lithographic printing plate precursor includes an aluminum support; and an image recording layer on the aluminum support, in which the aluminum support includes an anodized film on a surface of the image recording layer side, the anodized film has micropores extending in a depth direction from the surface of the anodized film on the image recording layer side, an average pore diameter of the micropores in the surface of the anodized film is greater than 0 µm and 0.03 µm or less, an average maximum diameter of the micropores inside the anodized film is in a range of 0.04 µm to 0.30 µm, an average value A nm of thicknesses of surface opening portions starting from the surface of the anodized film and having a pore diameter inside the anodized film of greater than 0 µm and 0.03 µm or less and an average value B nm of thicknesses of internal maximum diameter portions in which pore diameters of the micropores inside the anodized film are in a range of 0.04 µm to 0.30 µm satisfy a relationship of 2.5≤B/A≤28.0, the average value B of thicknesses of the internal maximum diameter portions is in a range of 500 nm to 2800 nm, and the image recording layer contains an acid color former.

In other words, the lithographic printing plate precursor according to the aspect A is a lithographic printing plate precursor that includes the aluminum support according to the aspect A and the image recording layer according to the aspect A.

According to a second aspect (hereinafter, also referred to as an "aspect B") of the lithographic printing plate precursor of the present disclosure, the lithographic printing plate precursor includes an aluminum support; and an image recording layer on the aluminum support, in which the aluminum support includes an anodized film on a surface of the image recording layer side, the anodized film has micropores extending in a depth direction from the surface of the anodized film on the image recording layer side, the micropores include at least large-diameter pores whose maximum diameter inside the anodized film is in a range of 0.01 µm and 0.30 µm, the average pore diameter of the micropores in the surface of the anodized film is 90% or less of the maximum diameter of the micropores inside the anodized film, the thickness of the anodized film is in a range of 550 nm to 2850 nm, and the image recording layer contains an acid color former.

In other words, the lithographic printing plate precursor according to the aspect B is a lithographic printing plate precursor that includes the aluminum support according to the aspect B and the image recording layer according to the aspect B.

Further, it is preferable that the lithographic printing plate precursor according to the present disclosure is a lithographic printing plate precursor for on-press development.

As the result of intensive examination conducted by the present inventors, it was found that the appearance failure occurs in a case where an aluminum support on which an anodized film is formed is used for a lithographic printing plate precursor and an image recording layer contains an acid color former.

The reason for this is speculated that a component (particularly, an anion containing a halogen atom) in the image recording layer infiltrates into the anodized film so that a part of an aluminum base of the aluminum support is dissolved, and thus an acid color former develops a color due to a generated acid.

In the present disclosure, the aluminum base indicates a portion of aluminum or an aluminum alloy below the anodized film of the aluminum support.

Here, as the result of intensive examination conducted by the present inventors, it was found that occurrence of the appearance failure is suppressed according to the lithographic printing plate precursor of the present disclosure.

The mechanism in which the above-described excellent effects are obtained is not clear, but can be speculated as follows.

According to the aspect A, it is speculated that, in a case where the average pore diameter of the micropores formed in the surface of the anodized film is greater than 0 µm and 0.03 µm or less, infiltration of the component in the above-described image recording layer into the micropores is speculated to be suppressed.

Further, it is speculated that, in a case where the average maximum diameter of the micropores inside the anodized film is in a range of 0.04 µm to 0.30 µm, the area of the bottom of the micropores increases, and dissolution of the anodized film is unlikely to be promoted even in a case where the component in the image recording layer infiltrates into the micropores.

Further, it is speculated that, in a case where the ratio represented by (the thickness B of the above-described internal maximum diameter portion/the thickness A of the above-described surface opening portion) is in a range of 2.5 to 28.0, the effects of suppressing the infiltration into the micropores and suppressing the dissolution are easily exhibited and the dissolution of the anodized film is unlikely to be promoted.

Moreover, according to the aspect B, it is speculated that, in a case where the micropores formed in the anodized film includes at least large-diameter pores whose maximum diameter inside the anodized film is in a range of 0.01 μm and 0.30 μm and the average pore diameter of the micropores in the surface of the anodized film is 90% or less of the maximum diameter of the micropores inside the anodized film, dissolution of the anodized film is unlikely to be promoted even in a case where the component in the image recording layer infiltrates into the micropores.

Further, in both of the aspect A and the aspect B, it is considered that the scratch resistance of the lithographic printing plate precursor is easily improved by allowing the micropores to have the above-described shape.

In the present disclosure, the scratch resistance of the lithographic printing plate precursor indicates a property in which, even in a case where scratches occur on the surface of the lithographic printing plate precursor on the image recording layer side due to scratching or the like during transportation of the lithographic printing plate precursor, stain is unlikely to be generated on the scratched sites after a lithographic printing plate is obtained.

The stain is considered to be generated in a case where the hydrophilicity of the surface of the aluminum support is not maintained because the scratches reach the aluminum base of the aluminum support.

However, it is speculated that a lithographic printing plate with excellent scratch resistance is easily obtained since the aluminum support of the present disclosure according to the aspect A has a sufficiently large thickness due to a two-layer structure of the surface opening portion whose average pore diameter is greater than 0 μm and 0.03 μm or less and the internal maximum diameter portion whose average maximum diameter is in a range of 0.04 μm to 0.30 μm and the hardness of the surface of the aluminum support is high due to a small average pore diameter of the surface opening portion.

Further, it is speculated that a lithographic printing plate with excellent scratch resistance is easily obtained since the thickness of the anodized film is in a range of 550 nm to 2850 nm so that the aluminum support of the present disclosure according to the aspect B has a sufficiently large thickness and the average pore diameter of the micropores in the surface of the anodized film is 90% or less of the maximum diameter of the micropores inside the anodized film so that the hardness of the surface of the aluminum support is high.

Hereinafter, the configuration of the lithographic printing plate precursor according to the present disclosure will be described. In the description of the accompanying drawings, the reference numerals are not provided in some cases.

<Aluminum Support>

FIG. 1 is a schematic cross-sectional view illustrating an example of an aluminum support according to the present disclosure.

An aluminum support 10 illustrated in FIG. 1 includes an anodized film 20 on an aluminum base 12. Further, an image recording layer and the like are formed on the anodized film 20.

[Aluminum Plate]

The aluminum support 10 is a metal, which is dimensionally stable and contains aluminum as a main component, and is formed of aluminum or an aluminum alloy. Examples of the aluminum support 10 include a pure aluminum plate, an alloy plate containing aluminum as a main component and a trace amount of heteroelements, and a plastic film or paper formed by laminating or depositing aluminum (alloy). Further, a composite sheet formed by bonding an aluminum sheet onto a polyethylene terephthalate film described in JP1973-018327B (JP-S48-018327B) may be employed.

Examples of the heteroelements contained in the aluminum alloy include silicon, iron, manganese, copper, magnesium, chromium, zinc, bismuth, nickel, and titanium, and the content of the heteroelements in the alloy is 10% by mass or less with respect to the total mass of the alloy. A pure aluminum plate is suitable as the aluminum support 10, but completely pure aluminum is difficult to produce because of a smelting technology. Therefore, the alloy may contain a trace amount of heteroelements.

The composition of the aluminum support 10 is not particularly limited, and publicly known materials can be appropriately used (for example, JIS A 1050, JIS A 1100, JIS A 3103, and JIS A 3005).

The width of the aluminum support 10 is preferably approximately 400 mm to 2000 mm, and the thickness thereof is preferably approximately 0.1 mm to 0.6 mm. The width and the thickness thereof can be appropriately changed depending on the size of the printing press, the size of the printing plate, the printed material to be obtained, and the like.

[Anodized Film (Aspect A)]

Hereinafter, first, the anodized film according to the aspect A will be described.

In FIG. 1, the anodized film 20 has micropores 30. The micropores 30 include a surface opening portion 32 (hereinafter, also simply referred to as a "surface opening portion 32") whose average pore diameter in the surface of the anodized film is greater than 0 μm and 0.03 μm or less, an internal maximum diameter portion 34 (hereinafter, also simply referred to as an "internal maximum diameter portion 34") whose average maximum diameter is in a range of 0.04 μm to 0.30 μm, and an opening portion 36.

In addition, the term micropores here is a commonly used term representing pores in the anodized film and does not specify the size of pores.

In the present disclosure, the surface opening portion 32 is a region continued from the opening portion 36 where the pore diameter of the micropore in the depth direction is greater than 0 μm and 0.03 μm or less.

Further, in the present disclosure, the internal maximum diameter portion 34 is a region positioned at a position deeper than the deepest portion of the surface opening portion 32 in the depth direction and is a region where the pore diameter of the micropore in the depth direction is in a range of 0.04 μm to 0.30 μm.

The aluminum support 10 according to the present disclosure may further include micropores other than the micropores 30, for example, micropores formed of the surface opening portion 32 without having the internal maximum diameter portion 34.

From the viewpoint of the scratch resistance, the density of the micropores 30 according to the present disclosure is preferably in a range of 100 pcs/mm² to 5000 pcs/mm² and more preferably 250 pcs/mm² to 3000 pcs/mm².

The density thereof is calculated as an arithmetic average value obtained by observing 4 sheets (N=4) of the surfaces of the anodized film 20 using a field emission scanning electron microscope (FE-SEM) at a magnification of 150000, measuring the number of micropores 30 present in a range of 400 nm×600 nm in the obtained four sheets of images, and averaging the measured values.

Figure 2:
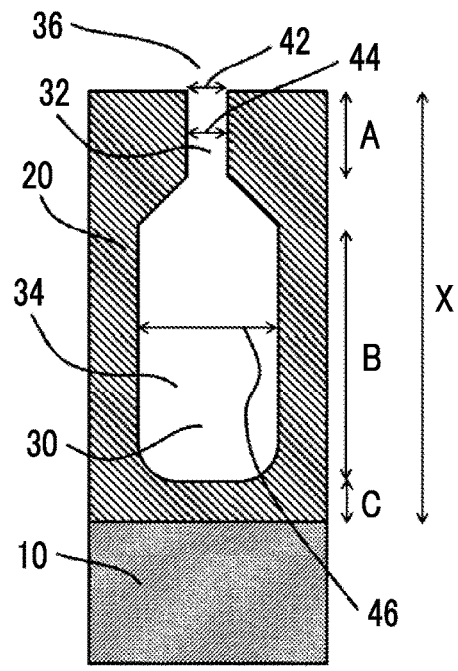
FIG. 2 is a cross-sectional view obtained by enlarging one micropore included in an aluminum support 10 according to the present disclosure.

FIG. 2 is a cross-sectional view obtained by enlarging one micropore included in the aluminum support 10 according to the present disclosure.

[Average Pore Diameter]

From the viewpoint of suppressing the appearance failure, an average pore diameter 42 in the surface of the anodized film is greater than 0 μm and 0.30 μm or less, preferably in a range of 0.01 μm to 0.25 μm, and more preferably in a range of 0.05 μm to 0.20 μm.

From the viewpoint of suppressing the appearance failure, an average maximum diameter 44 of the surface opening portion is preferably greater than 0 μm and 0.30 μm or less, more preferably in a range of 0.01 μm to 0.25 μm, and still more preferably in a range of 0.05 to 0.20 μm.

From the viewpoint of suppressing the appearance failure, an average maximum diameter 46 of the internal maximum diameter portion is in a range of 0.04 μm to 0.30 μm, preferably in a range of 0.05 μm to 0.27 μm, and more preferably in a range of 0.07 μm to 0.25 μm.

Further, the average pore diameter or the average maximum diameter of these is an arithmetic average value obtained by capturing (magnification of 150000) an image of a cross section of the anodized film 20, measuring the pore diameter or maximum diameter of 25 or more micropores, and averaging the obtained values.

The pore diameter of each micropore in the surface of the anodized film is measured as a pore diameter of the opening portion 36.

The pore diameter in the surface opening portion is measured as the maximum value among the pore diameters in the surface opening portion.

The pore diameter in the internal maximum diameter portion is measured as the maximum value among the pore diameters in the internal maximum diameter portion.

[Thickness]

In FIG. 2, A represents the thickness of the surface opening portion in which the pore diameter inside the anodized film starting from the surface of the anodized film is greater than 0 μm and 0.03 μm or less, and B represents the thickness of the internal maximum diameter portion.

In the aluminum support used in the present disclosure, from the viewpoint of suppressing occurrence of the appearance failure, the average value A of the thicknesses of the surface opening portions and the average value B of the thicknesses of the internal maximum diameter portions satisfies a relationship of 2.5≤B/A≤28.0, preferably a relationship of 3.0≤B/A≤25.0, and more preferably a relationship of 5.0≤B/A≤22.0.

In the present disclosure, each of the average values of the thickness A, the thickness B, the thickness C, and the thickness X described below is an arithmetic average value obtained by capturing (magnification of 150000) an image of a cross section of the anodized film 20, measuring the thickness of 25 or more micropores, and averaging the obtained values.

In the present disclosure, the arithmetic average value or the like of the thicknesses A is also referred to as the "average value A of the thickness".

From the viewpoint of suppressing occurrence of the appearance failure, the average value A of the thicknesses of the surface opening portions is preferably in a range of 10 nm to 200 nm, more preferably in a range of 20 nm to 180 nm, and still more preferably in a range of 30 nm to 160 nm.

From the viewpoints of suppressing occurrence of the appearance failure and suppressing peeling of the anodized film, the average value B of the thicknesses of the internal maximum diameter portions is preferably in a range of 500 nm to 2800 nm, preferably in a range of 600 nm to 2500 nm, and still more preferably in a range of 700 nm to 2200 nm.

In FIG. 2, C represents the thickness of the micropore 30 from the deepest portion to the aluminum base 12.

From the viewpoint of suppressing occurrence of the appearance failure, the average value C of the thicknesses is preferably in a range of 10 nm to 200 nm and more preferably in a range of 20 nm to 100 nm.

In FIG. 2, X represents the thickness of the entire anodized film 20.

From the viewpoints of suppressing occurrence of the appearance failure and suppressing peeling of the anodized film 20, the average value X of the thicknesses is preferably in a range of 300 nm to 5000 nm and more preferably in a range of 500 nm to 3000 nm.

From the viewpoint of improving the scratch resistance, it is preferable that a thickness X μm of the anodized film and a total amount Y g/m² of all layers formed on the aluminum support satisfy a relationship of Expression 1.

$$Y \geq -1.19X + 2.6 \qquad \text{Expression 1}$$

As all layers formed on the aluminum support, an undercoat layer, an image recording layer, an overcoat layer, and a protective layer described below are exemplified. The total amount Y g/m² is measured by dissolving each layer in a mixed solvent of methyl ethyl ketone (MEK), 1-methoxy-2-propanol (MFG), methyl alcohol (MA), and water and measuring the mass thereof.

[Void Volume]

From the viewpoint of the scratch resistance, the void volume of the anodized film 20 is preferably in a range of 10% to 40% and more preferably in a range of 15% to 35%.

The void volume thereof is calculated as an arithmetic average value obtained by observing 4 sheets (N=4) of the cross sections of the anodized film 20 using a field emission scanning electron microscope (FE-SEM) at a magnification of 150000, measuring the void volume in a range of 400 nm×600 nm in the obtained four sheets of images, and averaging the measured values.

In the anodized film 20, the micropores 30 may be distributed in the entire surface of the anodized film or in at least a portion thereof, but it is preferable that the micropores 30 is distributed in the entire surface thereof.

Further, it is preferable that the individual micropores 30 are uniformly distributed.

[Brightness of Surface of Anodized Film]

From the viewpoint of the plate inspectability (visibility) of the exposed lithographic printing plate precursor, the value of the brightness L* in the L*a*b* color system of the surface of the anodized film 20 on the image recording layer side is preferably in a range of 70 to 100 and more preferably in a range of 72 to 90.

The brightness L* is measured by performing a specular component excluded (SCE) system using a spectrophotometer CM2600d (manufactured by Konica Minolta Inc.) and operation software CM-S100 W.

[Steepness]

From the viewpoint of suppressing occurrence of the appearance failure, a steepness a45 representing the area ratio of a portion having an inclining degree of 45° or greater obtained by extracting a component with a wavelength of 0.2 μm to 2 μm in a frequency distribution based on fast Fourier transformation of three-dimensional data obtained by performing measurement using an atomic force microscope, in the surface of the anodized film 20 on a side of the image recording layer, is preferably 30% or less and more preferably 20% or less.

The steepness a45 is a factor representing the degree of sharpness in a fine shape of the surface of the aluminum support. Specifically, the steepness a45 represents the ratio of the area having an inclination of 45° or greater to the actual area in unevenness of the surface of the aluminum support.

The steepness a45 is measured according to the following method.

(1) Measurement of Surface Shape Using Atomic Force Microscope

In the present invention, first, the surface shape is measured using an atomic force microscope (AFM) to acquire three-dimensional data in order to acquire the steepness a45.

The measurement is performed under the following conditions. In other words, the aluminum support is cut into a size of 1 cm$^2$ and set on a horizontal sample stand that is provided on a piezo scanner, a cantilever is allowed to approach the surface of the sample, scanning is performed in the XY direction when reaching a region where atomic force works, and the unevenness of the sample is captured by the displacement of the piezo in the Z direction. A piezo scanner capable of performing scanning a distance of 150 μm in the XY direction and a distance of 10 μm in the Z direction is used as the piezo scanner. A cantilever having a resonance frequency of 120 to 150 kHz and a sprint frequency of 12 N/m to 20 N/m (SI-DF20, manufactured by Nanoprobes Inc.) is used in a dynamic force mode (DFM) as the cantilever. Further, by carrying out the least squares approximation of the acquired three-dimensional data, the slight inclination of the sample is corrected to acquire a reference surface.

During the measurement, 512×512 points in an area having a size of 50 μm×50 μm on the surface are measured. The resolution in the XY direction is 1.9 μm, the resolution in the Z direction is 1 nm, and the scanning speed is 60 μm/s.

(2) Correction of Three-Dimensional Data

In the calculation of the steepness a45, a component having a wavelength of 0.2 μm to 2 μm is removed from the three-dimensional data which has been acquired in (1) described above and is corrected. Due to this correction, in a case where a surface of an aluminum support or the like used in the lithographic printing plate precursor which has significant unevenness is scanned using a probe of an AFM, a noise occurring in a case where the probe strikes an edge portion of a projection and springs so that a portion other than a pointed end of the probe is brought into contact with a wall surface of a deep depression can be eliminated.

The correction is carried out by performing fast Fourier transformation on the three-dimensional data acquired in (1) described above to acquire the frequency distribution, removing a component having a wavelength of 0.2 μm to 2 μm, and performing Fourier inverse transformation.

[Method of Producing Aluminum Support]

The aluminum support used in the lithographic printing plate precursor according to the embodiment of the present invention can be prepared by performing a roughening treatment on the surface of the aluminum plate.

It is preferable that a combination of one or two or more treatments from among a mechanical roughening treatment, a chemical roughening treatment, and an electrochemical roughening treatment are used as the roughening treatment.

In the present disclosure, as the roughening treatment, at least an electrolytic roughening treatment is performed, and it is preferable that an alkali etching treatment (first alkali etching treatment) is performed before the electrolytic roughening treatment and also preferable that an alkali etching treatment (second alkali etching treatment) is performed after the electrolytic roughening treatment.

Further, as the roughening treatment, the electrochemical roughening treatment is performed twice, and it is preferable that an etching treatment is performed in an alkali aqueous solution between two electrochemical roughening treatments.

According to the first aspect, as an example, an etching treatment (first alkali etching treatment) carried out in an alkali aqueous solution, a desmutting treatment (first desmutting treatment) carried out in an acidic aqueous solution, an electrochemical roughening treatment (first electrolytic roughening treatment) carried out in an aqueous solution containing nitric acid or hydrochloric acid, an etching treatment (second alkali etching treatment) carried out in an alkali aqueous solution, a desmutting treatment (second desmutting treatment) carried out in an acidic aqueous solution, an electrochemical roughening treatment (second electrolytic roughening treatment) carried out in an aqueous solution that mainly contains hydrochloric acid, an etching treatment carried out in an alkali aqueous solution (third alkali etching treatment), a desmutting treatment (third desmutting treatment) carried out in an acidic aqueous solution, and an anodization treatment are performed in this order.

It is preferable that a mechanical roughening treatment is performed before the alkali etching treatment (first alkali etching treatment).

Further, it is preferable that a sealing treatment and a hydrophilization treatment are performed after the anodization treatment.

According to the second aspect, as an example, an etching treatment (first alkali etching treatment) carried out in an alkali aqueous solution, a desmutting treatment (first desmutting treatment) carried out in an acidic aqueous solution, an electrochemical roughening treatment (first electrolytic roughening treatment) carried out in an aqueous solution containing nitric acid or hydrochloric acid, an etching treatment (second alkali etching treatment) carried out in an alkali aqueous solution, a desmutting treatment (second desmutting treatment) carried out in an acidic aqueous solution, and an anodization treatment are performed in this order.

Further, it is preferable that a sealing treatment and a hydrophilization treatment are performed after the anodization treatment.

As the details of these treatments included in the first aspect and the second aspect, the methods described in paragraphs 0055 to 0149 of JP2011-068006A are preferably exemplified, and the description thereof is incorporated in the present specification.

[Anodized Film (Aspect B)]

Next, the anodized film according to the aspect B will be described.

In the aspect B, the surface opening portions 32 and the internal maximum diameter portions 34 in FIG. 1 are collectively referred to as "large-diameter pores".

Figure 3:
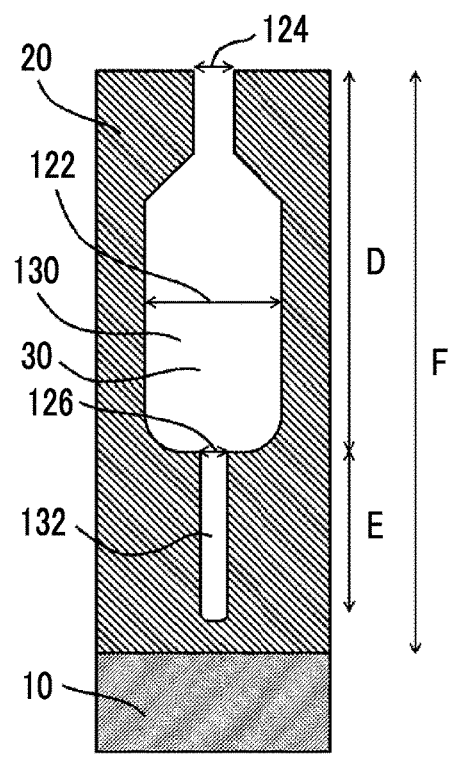
FIG. 3 is a cross-sectional view obtained by enlarging one micropore included in an aluminum support 10 according to an aspect B.

FIG. 3 illustrates an example of a cross-sectional view obtained by enlarging one micropore 30 according to an aspect B.

In FIG. 3, the reference numeral 130 represents a large-diameter pore, and a maximum diameter 122 of the large-diameter pore inside the anodized film is in a range of 0.01 μm to 0.30 μm.

Further, an average pore diameter 124 (in other words, the average pore diameter of the large-diameter pores in the surface of the anodized film) of the micropores inside the anodized film is 90% or less of the maximum diameter (in other words, the maximum diameter 122 of the large-diameter pores in the surface of the anodized film) of the micropores inside the anodized film.

In addition, the term micropores here is a commonly used term representing pores in the anodized film and does not specify the size of pores.

Further, a thickness F of the anodized film is in a range of 550 nm to 2850 nm.

In FIG. 3, a small-diameter pore 132 communicating the bottom of the large-diameter pore 130 is described, but the micropores 30 according to the aspect B may or may not have the small-diameter pores 132.

[Maximum Diameter of Large-Diameter Pore Inside Anodized Film]

The maximum diameter of the large-diameter pores inside the anodized film is in a range of 0.01 μm to 0.30 μm, and preferably in a range of 0.015 μm to 0.2 μm and more preferably in a range of 0.020 μm to 0.1 μm from the viewpoint of suppressing the appearance failure.

The average pore diameter of the micropores in the surface of the anodized film is 90% or less of the maximum diameter of the micropores inside the anodized film, and preferably in a range of 5% to 70% and more preferably in a range of 10% to 50% from the viewpoint of suppressing the appearance failure.

The pore diameter of each micropore in the surface of the anodized film is measured as the pore diameter of the opening portion 36.

The maximum diameter of the large-diameter pores inside the anodized film is measured as the maximum value from among the pore diameters of respective micropores in the internal maximum diameter portion.

[Shape of Large-Diameter Pore]

The shape of the large-diameter pore 130 is not particularly limited, and examples of the shape thereof include a substantially straight tubular shape (substantially cylindrical shape), a conical shape whose diameter decreases toward the depth direction (thickness direction), and an inverse conical shape whose diameter increases toward the depth direction (thickness direction). Further, the shape of the bottom portion of the large-diameter pore 130 is not particularly limited, but may be a curved shape (depression) or a planar shape.

[Small-Diameter Pore]

According to the aspect B, from the viewpoints that the thickness of the anodized film can be increased while stain and degradation of development are suppressed, it is preferable that the micropores are micropores which communicate with the bottom of the large-diameter pores, extend in the depth direction from the communication position, and further include small-diameter pores 132 having an average pore diameter of 0.01 μm or less and in which the pore diameter of the small-diameter pores 132 in the communication position is smaller than the pore diameter of the large-diameter pores 130 in the communication position. One small-diameter pore 132 may typically communicate with one large-diameter pore 130, but two or more small-diameter pores 132 may communicate with the bottom of one large-diameter pore 130.

[Pore Diameter of Small-Diameter Pore]

The pore diameter (the reference numeral 126 in FIG. 3) of the small-diameter pore in the communication position is smaller than the pore diameter of the large-diameter pore in the communication position. In regard to the average diameter of the large-diameter pores and the average diameter of the small-diameter pores, the ratio between the average diameter of the large-diameter pores and the average diameter of the small-diameter pores is preferably in a range of 1.1 to 12.5 and more preferably in a range of 1.5 to 10.

Further, the average pore diameter of the small-diameter pores is 0.01 μm or less, preferably in a range of 0.001 μm to 0.01 μm, and more preferably in a range of 0.003 to 0.01 μm.

The average diameter of the small-diameter pores 132 is calculated as an arithmetic average value obtained by observing 4 sheets (N=4) of the surfaces of the anodized film 20 using a field emission scanning electron microscope (FE-SEM) at a magnification of 150000, measuring the diameters of micropores (small-diameter pores) present in a range of 400 nm×600 nm in the obtained four sheets of images, and averaging the values. In a case where the depth of the large-diameter pores is large, the average pore diameter of small-diameter pores 132 may be acquired by cutting (for example, cutting the upper portion using argon gas) the upper portion (a region where large-diameter pores are present) of the anodized film 20 as necessary and observing the surface of the anodized film 20 using the above-described FE-SEM.

The average pore diameter of the small-diameter pores 132 is acquired as the arithmetic average value of the pore diameters of 25 micropores in the communication position of the small-diameter pores.

Further, in a case where the shape of the small-diameter pores 132 is not circular, an equivalent circle diameter is used.

[Shape of Small-Diameter Pore]

The shape of the small-diameter pore 132 is not particularly limited, and examples of the shape thereof include a substantially straight tubular shape (substantially cylindrical shape), a conical shape whose diameter decreases toward the depth direction, and a dendritic shape with branches toward the depth direction. Among these, a substantially straight tubular shape is preferable. Further, the diameter of the small-diameter pores 132 in the bottom may be different from the diameter of the small-diameter pores 132 in the communication position by 1 nm to 5 nm. The shape of the bottom portion of the small-diameter pore 132 is not particularly limited, but may be a curved shape (depression) or a planar shape.

[Thickness]

In FIG. 3, the thickness F is the thickness of the anodized film. The thickness F is in a range of 550 nm to 2850 nm. From the viewpoint of the scratch resistance, the thickness F is preferably in a range of 600 nm to 2500 nm and more preferably in a range of 700 nm to 2500 nm.

In FIG. 3, the thickness D is the depth of the large-diameter pores 130 from the surface of the anodized film to the bottom. From the viewpoints of suppressing the scratch resistance and the appearance failure, the average value of the thicknesses D in the support is preferably in a range of 100 nm to 1500 nm and more preferably in a range of 200 nm to 1000 nm.

In FIG. 3, the thickness E is the depth of the small-diameter pores 132 from the communication position to the bottom. From the viewpoints of suppressing the scratch resistance and the appearance failure, the average value of the thicknesses E in the support is preferably in a range of 100 nm to 2500 nm and more preferably in a range of 200 nm to 2000 nm.

According to the aspect B, in the anodized film 20, the micropores 30 may be distributed in the entire surface of the anodized film or in at least a portion thereof, but it is preferable that the micropores 30 is distributed in the entire surface thereof.

Further, it is preferable that the individual micropores 30 are uniformly distributed.

The void volume, the brightness of the surface of the anodized film, and the steepness according to the aspect B are the same as those according to the aspect A, and the preferable aspects thereof are the same as described above.

[Method of Producing Aluminum Support]

In a case where the anodized film according to the aspect B does not have the small-diameter pores 132, an aluminum support can be produced using the same method as the method of producing an aluminum support according to the aspect A.

Further, in a case where the anodized film according to the aspect B has the small-diameter pores 132, small-diameter pores can be formed by performing a pore widening treatment as necessary after the anodization treatment included in the method of producing an aluminum support according to the aspect A and performing the second anodization treatment step. As such a method of forming small-diameter pores, the methods described in paragraphs 0039 to 0090 of JP2011-173413A can be referred to. For example, the first anodization treatment or the second anodization treatment described in JP2011-173413A may be performed by appropriately setting the liquid components to be used, the current density, the time, and the like depending on the shape of the large-diameter pore and the shape of the small-diameter pore according to the aspect B.

<Image Recording Layer>

Hereinafter, the image recording layer, the undercoat layer, the overcoat layer, and the protective layer included in the lithographic printing plate precursor according to the present disclosure will be described. These layers according to the aspect A are the same as those according to the aspect B, and the preferred aspects thereof are the same as each other.

The lithographic printing plate precursor according to the present disclosure includes an image recording layer on the aluminum support.

The image recording layer according to the present disclosure may be a positive type image recording layer or a negative type image recording layer, but the image recording layer is a negative type image recording layer.

The image recording layer according to the present disclosure contains an acid color former.

Further, it is preferable that the image recording layer according to the present disclosure may further contain an acid generator.

Further, the film thickness of the image recording layer according to the present disclosure is preferably in a range of 0.5 μm to 2.5 μm, more preferably in a range of 0.6 to 2.2 μm, and still more preferably in a range of 0.7 μm to 2.0 μm.

The amount of the image recording layer is preferably in a range of 0.5 $g/m^2$ to 2.5 $g/m^2$, more preferably in a range of 0.6 $g/m^2$ to 2.2 $g/m^2$, and still more preferably in a range of 0.7 $g/m^2$ to 2.0 $g/m^2$.

[Acid Color Former]

The image recording layer contains an acid color former.

The "acid color former" used in the present disclosure indicates a compound that exhibits a color-developing property by being heated in a state of accepting an electron-accepting compound (for example, a proton such as an acid). As the acid color former, a colorless compound which has a partial skeleton such as a lactone, a lactam, a sultone, a spiropyran, an ester, or an amide and in which these partial skeletons are rapidly opened or cleaved at the time of being brought into contact with an electron-accepting compound is preferable.

Further, a leuco dye is preferable as the acid color former.

Examples of such an acid color former include phthalides such as 3,3-bis(4-dimethylaminophenyl)-6-dimethylaminophthalide (referred to as "crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-6-dimethylaminophthalide, 3,3-bis(2-phenylindol-3-yl)-6-dimethylaminophthalide, and 3-(4-dimethylaminophenyl)-3-(1-methylpyrrol-3-yl)-6-dimethylaminophthalide, 3,3-bis[1,1-bis(4-dimethylaminophenyl)ethylene-2-yl]-4,5,6,7-tetrachlorophthalide, 3,3-bis[1,1-bis(4-pyrrolidinophenyl)ethylene-2-yl]-4,5,6,7-tetrabromophthalide, 3,3-bis[1-(4-dimethylaminophenyl)-1-(4-methoxyphenyl)ethylene-2-yl]-4,5,6,7-tetrachlorophthalide, 3,3-bis[1-(4-pyrrolidinophenyl)-1-(4-methoxyphenyl)ethylene-2-yl]4,5,6,7-tetrachlorophthalide, 3-[1,1-di(1-ethyl-2-methylindol-3-yl)ethylene-2-yl]-3-(4-diethylaminophenyl)phthalide, 3-[1,1-di(1-ethyl-2-methylindol-3-yl)ethylene-2-yl]-3-(4-N-ethyl-N-phenylaminophenyl)phthalide, 3-(2-ethoxy-4-diethylaminophenyl)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, 4,4-bis-dimethylaminobenzhydrinbenzylether, N-halophenyl-leucoauramine, N-2,4,5-trichlorophenyl leucoauramine, rhodamine-B-anilinolactam, rhodamine-(4-nitroanilino)lactam, rhodamine-B-(4-chloroanilino)lactam, 3,7-bis(diethylamino)-10-benzoylphenoxazine, benzoyl leucomethylene blue, and 4-nitrobenzoyl methylene blue, fluorans such as 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluoran, 3-di-n-butylamino-7-(2'-fluorophenylamino)fluoran, 3-di-n-butylamino-7-(2' chlorophenylamino)fluoran, 3-N-isopentyl-N-ethylamino-7-(2'-chlorophenylamino) fluoran, 3-N-n-hexyl-N-ethylamino-7-(2'-chlorophenylamino)fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-pyrrolidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methylamino-6-methyl-7-anilinofluoran, 3-N-n-propyl-N-methylamino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-methylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-methylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3' methoxypropyl)-N-ethylamino-6-methyl-7-anilinofluoran, 3-N-(3'-ethoxypropyl)-N-methylamino-6-methyl-7-anilinofluoran, 3-N-(3' ethoxypropyl)-N-ethylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-ethyl-7-anilinofluoran, 3-diethylamino-6-methyl-7-(3'-methylphenyl amino)fluoran, 3-diethylamino-6-methyl-7-(2',6'-dimethylphenylamino)fluoran, 3-di-n-butylamino-6-methyl-7-(2',6'-dimethylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl] propane, 3-[4'-(4-phenylaminophenyl)aminophenyl]amino-6-methyl-7-chlorofluoran, and 3-[4'(dimethylaminophenyl)] amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexyl aminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4-azaphthalide, 3-(2-ethoxy-4-diethylaminophenyl)-3-(1-octyl-2-methylindol-3-yl)-7-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-ethyl-2-methylindol-3-yl)-7-azaphthalide, 3-(2-hexyloxy-4-diethylaminophenyl)-3-(1-ethyl-2-methylindol-3-yl)-4-azaphthalide, 3-(2-hexyloxy-4-diethylaminophenyl)-3-(1-ethyl-2-methylindol-3-yl)-7-azaphthalide, 3-(2-ethoxy-4-diethylaminophenyl)-3-(1-ethyl-2-phenylindol-3-yl)-4-azaphthalide, 3-(2-ethoxy-4-diethylaminophenyl)-3-(1-ethyl-2-phenylindol-3-yl)-7-azaphthalide, 3-(2-butoxy-4-diethylaminophenyl)-3-(1-ethyl-2-phenylindol-3-yl)-4-azaphthalide, 3-(2-butoxy-4-diethylaminophenyl)-3-(1-ethyl-2-phenylindol-3-yl)-7-azaphthalide, 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6' dimethylamino)phthalide.

Further, other examples thereof include 2-anilino-6'-(N-ethyl-N-isopentyl)amino-3'-methylspiro[isobenzofuran-1 (3H),9'-(9H)xanthen e]-3-one, 2'-anilino-6'-(N-ethyl-N-(4-methylphenyl))amino-3'-methylspiro[isobenzofuran-1(3H), 9'-(9H) xanthene]-3-one, 3'-N,N-dibenzyl amino-6'-N,N-diethylaminospiro[isobenzofuran-1(3H),9'-(9H)xanthene]-3-one, and 2'-(N-methyl-N-phenyl)amino-6'-(N-ethyl-N-(4-methylphenyl))aminospiro[isobenzofuran-1(3H),9'-(9H) xanthene]-3-one.

Among these, from the viewpoint of the color developability, it is preferable that the acid color former used in the present disclosure is at least one compound selected from the group consisting of a spiropyran compound, a spirooxazine compound, a spirolactone compound, and a spirolactam compound.

From the viewpoint of the visibility, it is preferable that the color tone of the dye after color development is green, blue, or black.

As the acid color former, a commercially available product can be used, and examples thereof include ETAC, RED500, RED520, CVL, S-205, BLACK305, BLACK400, BLACK100, BLACK500, H-7001, GREEN300, NIR-BLACK78, BLUE220, H-3035, BLUE203, ATP, H-1046, and H-2114 (all manufactured by Fukui Yamada Chemical Co., Ltd.), ORANGE-DCF, Vermilion-DCF, PINK-DCF, RED-DCF, BLMB, CVL, GREEN-DCF, and TH-107 (all manufactured by Hodogaya Chemical Co., Ltd.), ODB, ODB-2, ODB-4, ODB-250, ODB-BlackXV, Blue-63, Blue-502, GN-169, GN-2, Green-118, Red-40, and Red-8 (all manufactured by Yamamoto Chemicals Inc.), and Crystal Violet Lactone (manufactured by Tokyo Chemical Industry Co., Ltd.). Among these commercially available products, ETAC, S-205, BLACK305, BLACK400, BLACK100, BLACK500, H-7001, GREEN300, NIRBLACK78, H-3035, ATP, H-1046, H-2114, GREEN-DCF, Blue-63, GN-169, and Crystal Violet Lactone are preferable from the viewpoint of the visible light absorption rate of a film to be formed.

These acid color formers may be used alone or in combination of two or more kinds thereof.

The content of the acid color former is preferably in a range of 0.5% by mass to 10% by mass and more preferably in a range of 1% by mass to 5% by mass with respect to the total mass of the image recording layer.

[Acid Generator]

It is preferable that the image recording layer according to the present disclosure further contains an acid generator.

The acid generator may be a compound that generates an acid due to light or heat.

Further, in a case where the lithographic printing plate precursor contains a polymerization initiator described below, those that function as a polymerization initiator and an acid generator may be used.

—Organic Borate Compound—

From the viewpoint of suppressing occurrence of the appearance failure, it is preferable that the acid generator contains an organic borate compound as an acid generator.

It is preferable that the organic borate compound is a salt of an organic borate anion and a counter cation.

Preferred examples of the counter cation include an alkali metal ion, a tetraalkylammonium ion, and an onium cation (more preferably an iodonium cation or a sulfonium cation) in an onium salt used as a polymerization initiator described below.

Among these, as the counter cation, an alkali metal ion or a tetraalkylammonium ion is preferable, and a sodium ion, a potassium ion, or a tetrabutylammonium ion is more preferable.

Further, as the organic borate compound, a tetraaryl borate compound or a monoalkyl triaryl borate compound is preferable from the viewpoint of suppressing occurrence of the appearance failure, and a tetraphenyl borate compound is preferable from the viewpoint of the stability of the compound.

Further, a tetraaryl borate compound that contains one or more aryl groups containing an electron-withdrawing group is also preferable.

As the electron-withdrawing group, a group having a positive σ value based on Hammett's rule is preferable, and a group having a σ value of 0 to 1.2 based on Hammett's rule is more preferable. The details of the σ value (σp value and σm value) of Hammett's rule are described in Hansch, C.; Leo, A.; Taft, R. W., Chem. Rev., 1991, 91, p. 165 to 195.

As the electron-withdrawing group, a halogen atom, a trifluoromethyl group, or a cyano group is preferable, and a fluorine atom, a chlorine atom, a trifluoromethyl group, or a cyano group is more preferable.

It is preferable that a tetraphenyl borate compound is a salt of a tetraphenyl borate anion and a cation. As the cation, a cation that forms a salt with the above-described organic borate anion is preferably exemplified.

Examples of the acid generator in the present disclosure include the following compounds, but the present disclosure is not limited thereto. Here, $X_c^+$ represents a counter cation, and an alkali metal ion, a tetraalkylammonium ion, or an onium cation in an onium salt used as a polymerization initiator described below is preferable. Further, Bu represents an n-butyl group.

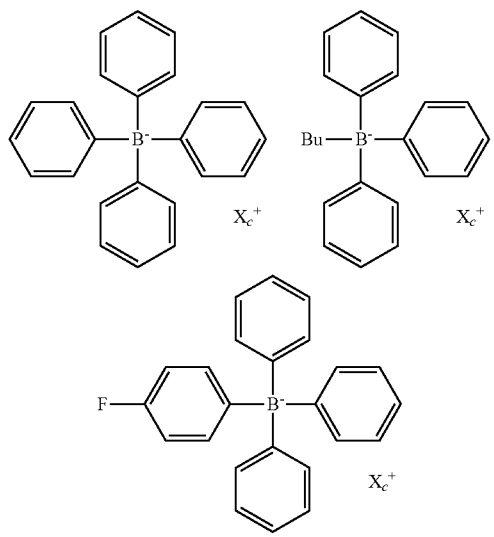

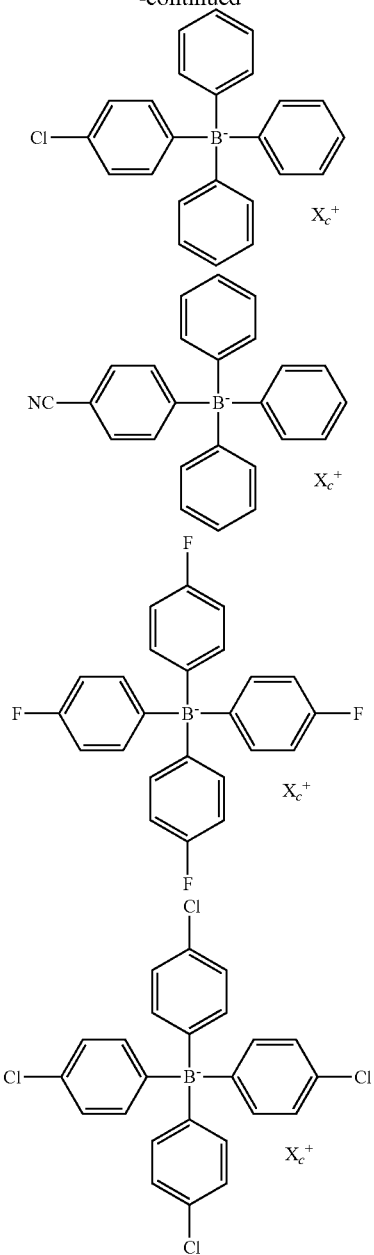

The image recording layer according to the present disclosure may contain one or two or more acid generators.

For example, a metal salt of an organic borate anion such as sodium tetraphenyl borate and a salt of an onium cation and an organic borate anion used as a polymerization initiator may be used in combination.

The content of the acid generator in the image recording layer according to the present disclosure is preferably in a range of 0.001% by mass to 10.0% by mass, more preferably in a range of 0.003% by mass to 5.0% by mass, and still more preferably in a range of 0.005% by mass to 3.0% by mass with respect to the total mass of the image recording layer.

[Preferred Aspect of Image Recording Layer]

It is preferable that the image recording layer in the present disclosure is an image recording layer according to any of the following first to fifth aspects.

First aspect: A color acid former, an infrared absorbing agent, a polymerizable compound, and a polymerization initiator are contained.

Second aspect: A color acid former, an infrared absorbing agent and thermoplastic polymer particles are contained.

Third aspect: In the first aspect, polymer particles or a microgel is further contained. Fourth aspect: In the first aspect, thermoplastic polymer particles are further contained.

Fifth aspect: In the fourth aspect, a microgel is further contained.

According to the first to fifth aspects, it is preferable that the above-described acid generator is further contained.

Further, according to the first and third to fifth aspects as described above, the polymerization initiator may further have a function as the acid generator.

According to the first aspect or the second aspect, it is possible to obtain a lithographic printing plate precursor that has excellent printing durability of a lithographic printing plate to be obtained.

According to the third aspect, it is possible to obtain a lithographic printing plate precursor having excellent on-press developability.

According to the fourth aspect, it is possible to obtain a lithographic printing plate precursor having excellent printing durability.

According to the fifth aspect, it is possible to obtain a lithographic printing plate precursor having excellent printing durability.

Further, as a positive type image recording layer, a known image recording layer can be used.

According to a preferred aspect of the lithographic printing plate precursor of the present disclosure, the image recording layer is an image recording layer (hereinafter, also referred to as an "image recording layer A") containing an infrared absorbing agent, a polymerization initiator, a polymerizable compound, and a binder polymer.

According to another preferred aspect of the lithographic printing plate precursor of the present disclosure, the image recording layer is an image recording layer (hereinafter, also referred to as an "image recording layer B") containing an infrared absorbing agent, a polymerization initiator, a polymerizable compound, and a polymer compound having a particle shape.

According to a still another preferred aspect of the lithographic printing plate precursor of the present disclosure, the image recording layer is an image recording layer (hereinafter, also referred to as an "image recording layer C") containing an infrared absorbing agent and thermoplastic polymer particles.

—Image Recording Layer A—

The image recording layer A contains an infrared absorbing agent, a polymerization initiator, a polymerizable compound, and a binder polymer. Hereinafter, the constituent components of the image recording layer A will be described.

<<Infrared Absorbing Agent>>

An infrared absorbing agent has a function of converting absorbed infrared rays into heat, a function of electron transfer to a polymerization initiator described below through excitation by infrared rays, a function of energy transfer, or a function of performing both of electron transfer and energy transfer. As the infrared absorbing agent used in the present disclosure, a coloring agent or a pigment having maximum absorption at a wavelength of 760 nm to 1,200 nm is preferable and a coloring agent is more preferable.

As the coloring agent, coloring agents described in paragraphs 0082 to 0088 of JP2014-104631A can be used.

The average particle diameter of the pigment is preferably in a range of 0.01 μm to 1 and more preferably in a range of 0.01 μm to 0.5 μm. A known dispersion technique used to produce inks or toners can be used for dispersion of the pigment. The details are described in "Latest Pigment Application Technology" (CMC Publishing Co., Ltd., 1986) and the like.

The infrared absorbing agent may be used alone or in combination of two or more kinds thereof.

The content of the infrared absorbing agent is preferably in a range of 0.05% by mass to 30% by mass, more preferably in a range of 0.1% by mass to 20% by mass, and particularly preferably in a range of 0.2% by mass to 10% by mass with respect to total mass of the image recording layer.

<<Polymerization Initiator>>

The polymerization initiator indicates a compound that initiates and promotes polymerization of a polymerizable compound. As the polymerization initiator, a known thermal polymerization initiator, a compound having a bond with small bond dissociation energy, or a photopolymerization initiator can be used. Specifically, radical polymerization initiators described in paragraphs 0092 to 0106 of JP2014-104631A can be used.

Preferred examples of compounds in the polymerization initiators include onium salts. Among these, iodonium salts and sulfonium salts are particularly preferable. Specific preferred examples of the compounds in each of the salts are the compounds described in paragraphs 0104 to 0106 of JP2014-104631A.

The content of the polymerization initiator is preferably in a range of 0.1% by mass to 50% by mass, more preferably in a range of 0.5% by mass to 30% by mass, and particularly preferably in a range of 0.8% by mass to 20% by mass with respect to the total mass of the image recording layer. When the content thereof is in the above-described range, improved sensitivity and improved stain resistance of a non-image area at the time of printing are obtained.

<<Polymerizable Compound>>

A polymerizable compound is an addition polymerizable compound having at least one ethylenically unsaturated bond and is selected from compounds having preferably at least one and more preferably two or more terminal ethylenically unsaturated bonds. These have chemical forms such as a monomer, a pre-polymer, that is, a dimer, a trimer, an oligomer, and a mixture of these. Specifically, polymerizable compounds described in paragraphs 0109 to 0113 of JP2014-104631A can be used.

Among the examples described above, from the viewpoint that the balance between hydrophilicity associated with on-press developability and polymerization ability associated with printing durability is excellent, isocyanuric acid ethylene oxide-modified acrylates such as tris(acryloyloxyethyl) isocyanurate and bis(acryloyloxyethyl)hydroxyethyl isocyanurate are particularly preferable.

The details of the structures of these polymerizable compounds, whether to be used alone or in combination, and the usage method such as the addition amount can be arbitrarily set according to the final performance design of a lithographic printing plate precursor. The content of the above-described polymerizable compound to be used is preferably in a range of 5% by mass to 75% by mass, more preferably in a range of 10% by mass to 70% by mass, and particularly preferably in a range of 15% by mass to 60% by mass with respect to the total mass of the image recording layer.

<<Binder Polymer>>

A binder polymer can be mainly used to improve the film hardness of the image recording layer. As the binder polymer, known polymers of the related art can be used and polymers having coated-film properties are preferable. Among examples thereof, an acrylic resin, a polyvinyl acetal resin, and a polyurethane resin are preferable.

Preferred examples of the binder polymers include polymers having a cross-linking functional group in the main or side chain, preferably in the side chain, for improving coated-film strength of an image area as described in JP2008-195018A. Cross-linking occurs between polymer molecules by a cross-linking group so that curing is promoted.

Preferred examples of the cross-linking functional group include an ethylenically unsaturated group such as a (meth) acryl group, a vinyl group, an allyl group, or a styryl group (a vinyl group bonded to a benzene ring) and an epoxy group, and the cross-linking functional groups can be introduced into a polymer by a polymer reaction or copolymerization. For example, a reaction between an acrylic polymer having a carboxy group in the side chain thereof or polyurethane and glycidyl methacrylate or a reaction between a polymer having an epoxy group and ethylenically unsaturated group-containing carboxylic acid such as methacrylic acid can be used.

The content of the cross-linking group in the binder polymer is preferably in a range of 0.1 to 10.0 mmol, more preferably in a range of 0.25 to 7.0 mmol, and particularly preferably in a range of 0.5 to 5.5 mmol with respect to 1 g of the binder polymer.

Moreover, it is preferable that the binder polymer includes a hydrophilic group. The hydrophilic group contributes to imparting on-press developability for the image recording layer. Particularly, in the coexistence of a cross-linking group and a hydrophilic group, both of printing durability and on-press developability can be achieved.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure having 1 to 9 alkylene oxide units having 2 or 3 carbon atoms is preferable. A monomer having a hydrophilic group may be copolymerized in order to provide a hydrophilic group for a binder polymer.

In addition, in order to control the impressing property, a lipophilic group such as an alkyl group, an aryl group, an aralkyl group, or an alkenyl group can be introduced into the binder polymer. For example, a lipophilic group-containing monomer such as methacrylic acid alkyl ester may be copolymerized.

The weight-average molecular weight (Mw) of the binder polymer is preferably 2,000 or greater, more preferably 5,000 or greater, and still more preferably in a range of 10,000 to 300,000.

The content of the binder polymer is preferably in a range of 3% by mass to 90% by mass, more preferably in a range of 5% by mass to 80% by mass, and still more preferably in a range of 10% by mass to 70% by mass with respect to the total mass of the image recording layer.

As a preferred example of the binder polymer, a polymer compound having a polyoxyalkylene chain in the side chain is exemplified. In a case where the image recording layer contains a polymer compound having a polyoxyalkylene chain in the side chain (hereinafter, also referred to as a POA chain-containing polymer compound), permeability of dampening water is promoted and on-press developability is improved.

Examples of the resin constituting the main chain of the POA chain-containing polymer compound include an acrylic resin, a polyvinyl acetal resin, a polyurethane resin, a polyurea resin, a polyimide resin, a polyamide resin, an epoxy resin, a methacrylic resin, a polystyrene resin, a novolak type phenolic resin, a polyester resin, synthetic rubber, and natural rubber. Among these, an acrylic resin is particularly preferable.

Further, in the present disclosure, a "main chain" indicates relatively the longest bonding chain in a molecule of a polymer compound constituting a resin and a "side chain" indicates a molecular chain branched from the main chain.

The POA chain-containing polymer compound does not substantially contain a perfluoroalkyl group. The expression "does not substantially contain a perfluoroalkyl group" means that the mass ratio of a fluorine atom present as a perfluoroalkyl group in a polymer compound is less than 0.5% by mass, and it is preferable that the polymer compound does not contain a fluorine atom. The mass ratio of the fluorine atom is measured by an elemental analysis method.

In addition, the "perfluoroalkyl group" is a group in which all hydrogen atoms of the alkyl group are substituted with fluorine atoms.

As alkylene oxide (oxyalkylene) in a polyoxyalkylene chain, alkylene oxide having 2 to 6 carbon atoms is preferable, ethylene oxide (oxyethylene) or propylene oxide (oxypropylene) is more preferable, and ethylene oxide is still more preferable.

The repetition number of the alkylene oxide in a polyoxyalkylene chain, that is, a polyalkylene oxide moiety is preferably in a range of 2 to 50 and more preferably in a range of 4 to 25.

In a case where the repetition number of the alkylene oxide is 2 or greater, the permeability of dampening water is sufficiently improved. Further, from the viewpoint that degradation in printing durability due to abrasion is suppressed, it is preferable that the repetition number thereof is 50 or less.

As the polyalkylene oxide moiety, structures described in paragraphs 0060 to 0062 of JP2014-104631A are preferable.

The POA chain-containing polymer compound may have cross-linking properties in order to improve coated-film strength of an image area. Examples of the POA chain-containing polymer compounds having cross-linking properties are described in paragraphs 0063 to 0072 of JP2014-104631A.

The proportion of repeating units having a poly(alkylene oxide) moiety in the total repeating units constituting the POA chain-containing polymer compound is not particularly limited, but is preferably in a range of 0.5% by mole to 80% by mole and more preferably in a range of 0.5% by mole to 50% by mole. Specific examples of the POA chain-containing polymer compounds are described in paragraphs 0075 and 0076 of JP2014-104631A.

As the POA chain-containing polymer compound, hydrophilic macromolecular compounds such as polyacrylic acid and polyvinyl alcohol described in JP2008-195018A can be used in combination as necessary. Further, a lipophilic polymer compound and a hydrophilic polymer compound can be used in combination.

In addition to the presence of the POA chain-containing polymer compound in the image recording layer as a binder that plays a role of connecting image recording layer components with each other, the specific polymer compound may be present in the form of a particle. In a case where the specific polymer compound is present in the form of a particle, the average particle diameter is preferably in a range of 10 nm to 1,000 nm, more preferably in a range of 20 nm to 300 nm, and particularly preferably in a range of 30 nm to 120 nm.

The content of the POA chain-containing polymer compound is preferably in a range of 3% by mass to 90% by mass and more preferably in a range of 5% by mass to 80% by mass with respect to the total mass of the image recording layer. In a case where the content thereof is in the above-described range, both of permeability of dampening water and image formability can be reliably achieved.

Other preferred examples of the binder polymer include a polymer compound (hereinafter, also referred to as a "star type polymer compound") which has a polymer chain bonded to a nucleus through a sulfide bond by means of using a polyfunctional, in a range of hexa- to deca-functional, thiol as the nucleus and in which the polymer chain has a polymerizable group. As the star type polymer compound, for example, compounds described in JP2012-148555A can be preferably used.

Examples of the star type polymer compound include compounds having a polymerizable group such as an ethylenically unsaturated bond in the main chain or in the side chain, preferably in the side chain, for improving coated-film strength of an image area as described in JP2008-195018A. Cross-linking occurs between polymer molecules by a polymerizable group so that curing is promoted.

Preferred examples of the polymerizable group include an ethylenically unsaturated group such as a (meth)acryl group, a vinyl group, an allyl group, or a styryl group and an epoxy group. Among these, from the viewpoint of polymerization reactivity, a (meth)acryl group, a vinyl group, or a styryl group is more preferable and a (meth)acryl group is particularly preferable. These groups can be introduced into a polymer by a polymer reaction or copolymerization. For example, a reaction between a polymer having a carboxy group in the side chain thereof and glycidyl methacrylate or a reaction between a polymer having an epoxy group and ethylenically unsaturated group-containing carboxylic acid such as methacrylic acid can be used. These groups may be used in combination.

The content of the cross-linking group in the star type polymer compound is preferably in a range of 0.1 mmol to 10.0 mmol, more preferably in a range of 0.25 mmol to 7.0 mmol, and particularly preferably in a range of 0.5 mmol to 5.5 mmol with respect to 1 g of the star type polymer compound.

Moreover, it is preferable that the star type polymer compound further includes a hydrophilic group. The hydrophilic group contributes to providing on-press developability for the image recording layer. Particularly, in the coexistence of a polymerizable group and a hydrophilic group, both of printing durability and on-press developability can be achieved.

Examples of the hydrophilic group include $-SO_3M^1$, $-OH$, $-CONR^1R^2$ ($M^1$ represents a hydrogen atom, a metal ion, an ammonium ion, or a phosphonium ion, $R^1$ and $R^2$ each independently represent a hydrogen atom, an alkyl group, an alkenyl group, or an aryl group, and $R^1$ and $R^2$ may be bonded to each other to form a ring), $-N^+R^3R^4R^5X^-$ ($R^3$ to $R^5$ each independently represent an alkyl group having 1 to 8 carbon atoms and $X^-$ represents a counter anion), $-(CH_2CH_2O)_nR$, and $-(C_3H_6O)_mR$.

In the above-described formulae, n and m each independently represent an integer of 1 to 100 and R's each independently represent a hydrogen atom or an alkyl group having 1 to 18 carbon atoms.

Here, in a case where the star type polymer compound is a star type polymer compound having a polyoxyalkylene chain (for example, $-(CH_2CH_2O)_nR$, and $-(C_3H_6O)_nR$) in the side chain, such a star type polymer compound is a polymer compound having the above-described polyoxyalkylene chain in the side chain.

Among these hydrophilic groups, $-CONR^1R^2$, $-(CH_2CH_2O)_nR$, or $-(C_3H_6O)_mR$ is preferable, $-CONR^1R^2$ or $-(CH_2CH_2O)_nR$ is more preferable, and $-(CH_2CH_2O)_nR$ is particularly preferable. In $-(CH_2CH_2O)_nR$, n represents an integer of preferably 1 to 10 and particularly preferably 1 to 4. Further, R represents more preferably a hydrogen atom or an alkyl group having 1 to 4 carbon atoms and particularly preferably a hydrogen atom or a methyl group. These hydrophilic groups may be used in combination of two or more kinds thereof.

Further, it is preferable that the star type polymer compound does not substantially include a carboxylic acid group, a phosphoric acid group, or a phosphonic acid group. Specifically, the amount of these acid groups is preferably less than 0.1 mmol/g, more preferably less than 0.05 mmol/g, and particularly preferably 0.03 mmol/g or less. In a case where the amount of these acid groups is less than 0.1 mmol/g, on-press developability is further improved.

In order to control impressing properties, a lipophilic group such as an alkyl group, an aryl group, an aralkyl group, or an alkenyl group can be introduced to the star type polymer compound. Specifically, a lipophilic group-containing monomer such as methacrylic acid alkyl ester may be copolymerized.

Specific examples of the star type polymer compound include compounds described in paragraphs 0153 to 0157 of JP2014-104631A.

The star type polymer compound can be synthesized, using a known method, by performing radical polymerization on the above-described monomers constituting a polymer chain in the presence of the above-described polyfunctional thiol compound.

The weight-average molecular weight (Mw) of the star type polymer compound is preferably in a range of 5,000 to 500,000, more preferably in a range of 10,000 to 250,000, and particularly preferably in a range of 20,000 to 150,000. In a case where the weight-average molecular weight thereof is in the above-described range, the on-press developability and the printing durability are more improved.

The star type polymer compound may be used alone or in combination of two or more kinds thereof. Further, the star type polymer compound may be used in combination with a typical linear binder polymer.

The content of the star type polymer compound is preferably in a range of 5% by mass to 95% by mass, more preferably in a range of 10% by mass to 90% by mass, and particularly preferably in a range of 15% by mass to 85% by mass with respect to the total mass of the image recording layer.

From the viewpoint of promoting the permeability of dampening water and improving the on-press developability, star type polymer compounds described in JP2012-148555A are particularly preferable.

<<Other Components>>

The image recording layer A can contain other components described below.

(1) Low-Molecular Weight Hydrophilic Compound

In order to improve the on-press developability without degrading the printing durability, the image recording layer may contain a low-molecular weight hydrophilic compound.

As the low-molecular weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among these, it is preferable that the image recording layer contains at least one selected from the group consisting of polyols, organic sulfates, organic sulfonates, and betaines.

Specific examples of the compounds of the organic sulfonates include compounds described in paragraphs 0026 to 0031 of JP2007-276454A and paragraphs 0020 to 0047 of JP2009-154525A. The salt may be potassium salt or lithium salt.

Examples of the organic sulfate include compounds described in paragraphs 0034 to 0038 of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethylammonio butyrate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular weight hydrophilic compound has a small structure of a hydrophobic portion, hydrophobicity or coated-film strength of an image area is not degraded by dampening water permeating into an image recording layer exposed portion (image area) and ink receptivity or printing durability of the image recording layer can be maintained satisfactorily.

The amount of the low-molecular weight hydrophilic compounds to be added to the image recording layer is preferably in a range of 0.5% by mass to 20% by mass, more preferably in a range of 1% by mass to 15% by mass, and still more preferably in a range of 2% by mass to 10% by mass with respect to the total mass of the image recording layer. In a case where the amount thereof is in the above-described range, excellent on-press developability and printing durability can be obtained.

These low-molecular weight hydrophilic compounds may be used alone or in combination of two or more kinds thereof.

(2) Oil Sensitizing Agent

In order to improve the impressing property, an oil sensitizing agent such as a phosphonium compound, a nitrogen-containing low-molecular compound, or an ammonium group-containing polymer can be used for the image recording layer. Particularly, in a case where a protective layer contains an inorganic layered compound, the above-described compounds function as a surface coating agent of the inorganic layered compound and prevent a degradation in impressing property due to the inorganic layered compound during the printing.

The phosphonium compound, the nitrogen-containing low-molecular compound, and the ammonium group-containing polymer are described in paragraphs 0184 to 0190 of JP2014-104631A in detail.

The content of the oil sensitizing agent is preferably in a range of 0.01% by mass to 30.0% by mass, more preferably in a range of 0.1% by mass to 15.0% by mass, and still more preferably in a range of 1% by mass to 10% by mass with respect to the total mass of the image recording layer.

(3) Other Components

The image recording layer may further contain other components such as a surfactant, a coloring agent, a printing-out agent, a polymerization inhibitor, a higher fatty acid derivative, a plasticizer, inorganic particles, an inorganic layered compound, a co-sensitizer, and a chain transfer agent. Specifically, the compounds and the addition amounts described in paragraphs 0114 to 0159 of JP2008-284817A, paragraphs 0023 to 0027 of JP2006-091479A, and paragraph 0060 of US2008/0311520A can be preferably used.

<<Formation of Image Recording Layer A>>

The image recording layer A is formed by dispersing or dissolving each of the above-described required components in a known solvent to prepare a coating solution, coating an aluminum support with the coating solution directly or through an undercoat layer using a known method such as a bar coater coating method, and drying the resultant, as described in paragraphs 0142 and 0143 of JP2008-195018A. The coating amount of the image recording layer (solid content) on the aluminum support to be obtained after the coating and the drying varies depending on the applications thereof, but is preferably in a range of 0.3 $g/m^2$ to 3.0 $g/m^2$. In a case where the coating amount thereof is in the above-described range, excellent sensitivity and excellent film-coating characteristics of the image recording layer are obtained.

—Image Recording Layer B—

The image recording layer B contains an infrared absorbing agent, a polymerization initiator, a polymerizable compound, and a polymer compound having a particle shape. Hereinafter, the constituent components of the image recording layer B will be described.

Similarly, the infrared absorbing agent, the polymerization initiator, and the polymerizable compound described in the image recording layer A can be used as an infrared absorbing agent, a polymerization initiator, and a polymerizable compound in the image recording layer B.

<<Polymer Compound Having Particle Shape>>

It is preferable that the polymer compound having a particle shape is selected from the group consisting of thermoplastic polymer particles, thermally reactive polymer particles, polymer particles having a polymerizable group, a microcapsule encapsulating a hydrophobic compound, and a microgel (cross-linked polymer particle). Among these, polymer particles having a polymerizable group and a microgel are preferable. According to a particularly preferred embodiment, the polymer compound having a particle shape includes at least one ethylenically unsaturated polymerizable group. Because of the presence of the polymer compound having a particle shape, effects of improving the printing durability of an exposed portion and the on-press developability of an unexposed portion are obtained.

Further, it is preferable that the polymer compound having a particle shape is a thermoplastic polymer particle.

Preferred examples of the thermoplastic polymer particles include hydrophobic thermoplastic polymer particles described in Research Disclosure No. 33303 on January, 1992, JP1997-123387A (JP-H09-123387A), JP1997-

131850A (JP-H09-131850A), JP1997-171249A (JP-H09-171249A), JP1997-171250A (JP-H09-171250A), and EP931647B.

Specific examples of a polymer constituting thermoplastic polymer particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, (meth)acrylonitrile, vinyl carbazole, and polyalkylene, and mixtures of these. Among these, polystyrene, styrene, a copolymer containing acrylonitrile, and polymethylmethacrylate are more preferable. From the viewpoint that the balance between UV printing durability and the on-press developability is excellent, a copolymer of a styrene-(meth)acrylonitrile-poly(ethylene glycol)monoalkyl ether (meth)acrylate compound is preferably exemplified as the copolymer containing styrene and (meth)acrylonitrile. The average particle diameter of the thermoplastic polymer particles is preferably in a range of 0.01 µm to 3.0 µm.

Examples of the thermally reactive polymer particles include polymer particles having a thermally reactive group. The thermally reactive polymer particles are cross-linked by a thermal reaction and have hydrophobic regions formed by a change in functional groups during the cross-linking.

As the thermally reactive group in polymer particles having a thermally reactive group, a functional group that performs any reaction may be used as long as a chemical bond is formed, but a polymerizable group is preferable. Preferred examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having active hydrogen atoms as the reaction partners of these (such as an amino group, a hydroxy group, or a carboxy group); a carboxy group that performs a condensation reaction and a hydroxy group or an amino group as a reaction partner thereof; and an acid anhydride that performs a ring opening addition reaction and an amino group or a hydroxy group as a reaction partner thereof The microcapsule is a microcapsule in which at least a part of constituent components of the image recording layer is encapsulated as described in JP2001-277740A and JP2001-277742A. Further, the constituent components of the image recording layer may be contained in a portion other than the microcapsule. Moreover, a preferred aspect of the image recording layer containing the microcapsule is an aspect in which hydrophobic constituent components are encapsulated by a microcapsule and hydrophilic constituent components are contained by a portion other than the microcapsule.

The microgel (cross-linked polymer particles) may contain a part of the constituent components of the image recording layer in at least one of the surface or the inside thereof. From the viewpoints of image forming sensitivity and printing durability, a reactive microgel having a radical polymerizable group on the surface thereof is particularly preferable.

The constituent components of the image recording layer can be made into microcapsules or microgel particles using a known method.

From the viewpoints of the printing durability, stain resistance, and storage stability, it is preferable that the polymer compound having a particle shape is obtained by reacting a polyvalent isocyanate compound which is an adduct of a polyhydric phenol compound containing two or more hydroxy groups in a molecule and isophorone diisocyanate with a compound containing active hydrogen.

As the polyhydric phenol compound, a compound having a plurality of benzene rings containing a phenolic hydroxy group is preferable.

As the compound that contains a compound containing the above-described active hydrogen, a polyol compound or a polyamine compound is preferable, a polyol compound is more preferable, and at least one compound selected from the group consisting of propylene glycol, glycerin, and trimethylolpropane is still more preferable.

As the resin particles obtained by reacting the compound containing active hydrogen with the polyvalent isocyanate compound which is an adduct of a polyhydric phenol compound containing two or more hydroxy groups in a molecule and isophorone diisocyanate, polymer particles described in paragraphs 0032 to 0095 of JP2012-206495A are preferably exemplified.

Further, from the viewpoints of the printing durability and the solvent resistance, it is preferable that the polymer compound having a particle shape has a hydrophobic main chain and both of a constitutional unit (i) which contains a pendant-cyano group directly bonded to the hydrophobic main chain and a constitutional unit (ii) which contains a pendant group having a hydrophilic polyalkylene oxide segment.

As the hydrophobic main chain, an acrylic resin chain is preferably exemplified. Preferred examples of the pendant-cyano group include —[CH$_2$CH(C≡N)—] and —[CH$_2$C(CH$_3$)(C≡N)—].

Further, the constitutional unit having a pendant-cyano group can be easily derived from an ethylene-based unsaturated monomer such as acrylonitrile or methacrylonitrile or a combination of these.

Further, as the alkylene oxide in the hydrophilic polyalkylene oxide segment, ethylene oxide or propylene oxide is preferable and ethylene oxide is more preferable.

The repetition number of alkylene oxide structures in the hydrophilic polyalkylene oxide segment is preferably in a range of 10 to 100, more preferably in a range of 25 to 75, and still more preferably in a range of 40 to 50.

As the resin particles which have a hydrophobic main chain and both of a constitutional unit (i) containing a pendant-cyano group directly bonded to the hydrophobic main chain and a constitutional unit (ii) containing a pendant group having a hydrophilic polyalkylene oxide segment, those described in paragraphs 0039 to 0068 of JP2008-503365A are preferably exemplified.

The average particle diameter of the polymer compound having a particle shape is preferably in a range of 0.01 µm to 3.0 µm, more preferably in a range of 0.03 µm to 2.0 µm, and still more preferably in a range of 0.10 µm to 1.0 µm. In a case where the average particle diameter thereof is in the above-described range, excellent resolution and temporal stability are obtained.

The content of the polymer compound having a particle shape is preferably in a range of 5% by mass to 90% by mass with respect to the mass of the image recording layer.

<<Other Components>>

The image recording layer B can contain other components described in the above-described image recording layer A as necessary.

<<Formation of Image Recording Layer B>>

The image recording layer B can be formed in the same manner as the image recording layer A described above.

—Image Recording Layer C—

The image recording layer C contains an infrared absorbing agent and thermoplastic polymer particles. Hereinafter, the constituent components of the image recording layer C will be described.

<<Infrared Absorbing Agent>>

As the infrared absorbing agent contained in the image recording layer C, a dye or a pigment having maximum absorption at a wavelength of 760 nm to 1,200 nm is preferable. A dye is more preferable.

As the dye, commercially available dyes and known dyes described in the literatures (for example, "Dye Handbook" edited by The Society of Synthetic Organic Chemistry, Japan, published in 1970, "Near Infrared Absorbing Dyes" of "Chemical Industry", p. 45 to 51, published on May, 1986, and "Development and Market Trend of Functional Dyes in 1990's" Section 2.3 of Chapter 2 (CMC Publishing Co., Ltd., 1990)) and the patents can be used. Specific preferred examples thereof include infrared absorbing dyes such as an azo dye, a metal complex salt azo dye, a pyrazolone azo dye, an anthraquinone dye, a phthalocyanine dye, a carbonium dye, a quinone imine dye, a polymethine dye, and a cyanine dye.

Among these, infrared absorbing dyes having a water-soluble group are particularly preferable from the viewpoint of addition to the image recording layer C.

Specific examples of the infrared absorbing dyes are described below, but the present disclosure is not limited thereto.

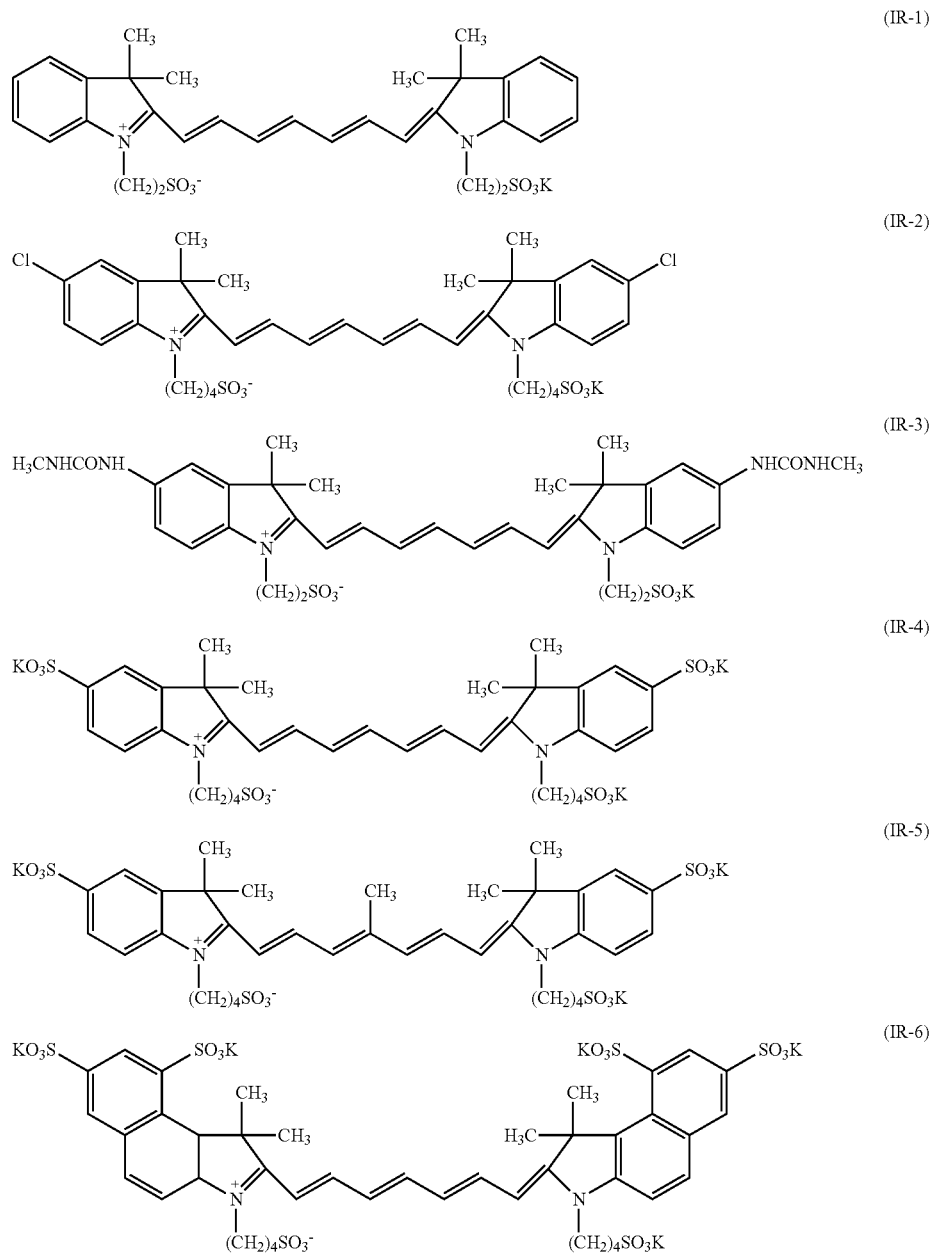

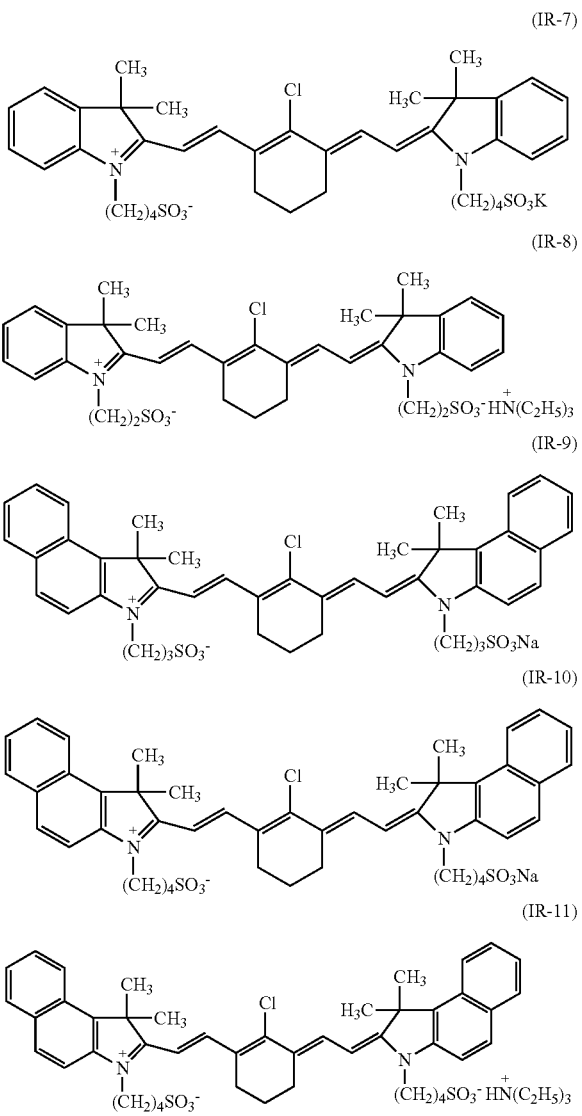

As the pigments, commercially available pigments and pigments described in Color Index (C. I.) Handbook, "Latest Pigment Handbook" (edited by Japan Pigment Technology Association, 1977), "Latest Pigment Application Technology" (CMC Publishing Co., Ltd., 1986), and "Printing Ink Technology" (CMC Publishing Co., Ltd., 1984) can be used.

The particle diameter of the pigment is preferably in a range of 0.01 μm to 1 μm and more preferably in a range of 0.01 μm to 0.5 μm. A known dispersion technique used to produce inks or toners can be used as a method of dispersing the pigment. The details are described in "Latest Pigment Application Technology" (CMC Publishing Co., Ltd., 1986).

The content of the infrared absorbing agent is preferably in a range of 0.1% by mass to 30% by mass, more preferably in a range of 0.25% by mass to 25% by mass, and particularly preferably in a range of 0.5% by mass to 20% by mass with respect to the total mass of the image recording layer. In a case where the content thereof is in the above-described range, excellent sensitivity is obtained while suppressing degradation of the film hardness of the image recording layer.

<<Thermoplastic Polymer Particles>>

The glass transition temperature (Tg) of the thermoplastic polymer particles is preferably in a range of 60° C. to 250° C. The Tg of the thermoplastic polymer particles is more preferably in a range of 70° C. to 140° C. and still more preferably in a range of 80° C. to 120° C.

Preferred examples of the thermoplastic polymer particles having a Tg of 60° C. or higher include thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples thereof include homopolymers or copolymers formed of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Among these, polystyrene, a copolymer containing styrene and acrylonitrile, and polymethylmethacrylate are preferable.

The average particle diameter of the thermoplastic polymer particles is preferably in a range of 0.005 μm to 2.0 μm from the viewpoints of the resolution and the temporal stability. This value is used as the average particle diameter in a case where two or more kinds of thermoplastic polymer particles are mixed with each other. The average particle diameter thereof is more preferably in a range of 0.01 μm to 1.5 μm and particularly preferably in a range of 0.05 μm to 1.0 μm. The polydispersity in a case where two or more kinds of thermoplastic polymer particles are mixed with each other is preferably 0.2 or greater.

The average particle diameter and the polydispersity are calculated according to a laser light scattering method.

The thermoplastic polymer particles may be used in combination of two or more kinds thereof. Specifically, at least two kinds of thermoplastic polymer particles with different particle sizes or at least two kinds of thermoplastic polymer particles with different glass transition temperatures (Tg) may be exemplified. In a case where two or more kinds of thermoplastic polymer particles are used in combination, coated-film curing properties of an image area are further improved and printing durability in a case where a lithographic printing plate is obtained is further improved.

For example, in a case where thermoplastic polymer particles having the same particle size are used, voids are present between the thermoplastic polymer particles to some extent, the curing properties of the coated-film are not desirable in some cases even in a case where the thermoplastic polymer particles are melted and solidified by image exposure. Meanwhile, in a case where thermoplastic polymer particles having different particle sizes are used, the void volume between the thermoplastic polymer particles can be decreased and thus the coated-film curing properties of the image area after image exposure can be improved.

Further, in a case where thermoplastic polymer particles having the same Tg are used, the thermoplastic polymer particles are not sufficiently melted and solidified and, accordingly, the coated-film curing properties are not desirable in some cases when an increase in temperature of the image recording layer resulting from image exposure is insufficient. Meanwhile, in a case where thermoplastic polymer particles having different glass transition temperatures (Tg) are used, the coated-film curing properties of the image area can be improved when an increase in temperature of the image recording layer resulting from image exposure is insufficient.

In a case where two or more kinds of thermoplastic polymer particles having different glass transition temperatures (Tg) are used in combination, the Tg of at least one thermoplastic polymer particle is preferably 60° C. or higher. At this time, a difference in Tg is preferably 10° C. or higher and more preferably 20° C. or higher. In addition, the content of the thermoplastic polymer particles having a Tg of 60° C. or higher is preferably 70% by mass or greater with respect to the total amount of all thermoplastic polymer particles.

The thermoplastic polymer particles may include a cross-linking group. In a case where thermoplastic polymer particles having a cross-linking group are used, the cross-linking group is thermally reacted due to heat generated by an image-exposed portion, cross-linking occurs between polymers, coated-film strength of an image area is improved, and printing durability becomes more excellent. As the cross-linking group, a functional group, in which any reaction may occur, is not limited as long as a chemical bond is formed, and examples thereof include an ethylenically unsaturated group that performs a polymerization reaction (such as an acryloyl group, a methacryloyl group, a vinyl group, or an allyl group); an isocyanate group that performs an addition reaction or a block body thereof, and a group having active hydrogen atoms as the reaction partners of these (such as an amino group, a hydroxy group, or a carboxyl group); an epoxy group that performs an addition reaction and an amino group, a carboxyl group or a hydroxy group as reaction partners thereof; a carboxyl group that performs a condensation reaction and a hydroxy group or an amino group; and an acid anhydride that performs a ring opening addition reaction and an amino group or a hydroxy group.

Specific examples of the thermoplastic polymer particles having a cross-linking group include thermoplastic polymer particles having cross-linking groups such as an acryloyl group, a methacryloyl group, a vinyl group, an allyl group, an epoxy group, an amino group, a hydroxy group, a carboxyl group, an isocyanate group, an acid anhydride, and a group protecting these. These cross-linking groups may be introduced to polymers at the time of polymerization of particle polymers or may be introduced using a polymer reaction after polymerization of particle polymers.

In a case where a cross-linking group is introduced to a polymer at the time of polymerization of polymer particles, it is preferable that a monomer having a cross-linking group may be subjected to an emulsion polymerization or suspension polymerization. Specific examples of the monomer having a cross-linking group include allyl methacrylate, allyl acrylate, vinyl methacrylate, vinyl acrylate, glycidyl methacrylate, glycidyl acrylate, 2-isocyanate ethyl methacrylate or block isocyanate resulting from alcohol thereof, 2-isocyanate ethyl acrylate or block isocyanate resulting from alcohol thereof, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate.

Examples of the polymer reaction used in a case where a cross-linking group is introduced after polymerization of polymer particles include polymer reactions described in WO96/034316A.

Polymer particles may react with each other through a cross-linking group or the thermoplastic polymer particles may react with a polymer compound or a low-molecular compound added to the image recording layer.

The content of the thermoplastic polymer particles is preferably in a range of 50% by mass to 95% by mass, more preferably in a range of 60% by mass to 90% by mass, and particularly preferably in a range of 70% by mass to 85% by mass with respect to the total mass of the image recording layer.

<<Other Components>>

The image recording layer C may contain other components as necessary.

As other components, a surfactant having a polyoxyalkylene group or a hydroxy group is preferably exemplified.

As a surfactant having a polyoxyalkylene group (hereinafter, also referred to as a "POA group") or a hydroxy group, a surfactant having a POA group or a hydroxy group can be suitably used, but an anionic surfactant or a non-ionic surfactant is preferable. Among anionic surfactants or non-ionic surfactants having a POA group or a hydroxy group, anionic surfactants or non-ionic surfactants having a POA group are preferable.

As the POA group, a polyoxyethylene group, a polyoxypropylene group, or a polyoxybutylene group is preferable and a polyoxyethylene group is particularly preferable.

The average degree of polymerization of an oxyalkylene group is preferably in a range of 2 to 50 and more preferably in a range of 2 to 20.

The number of hydroxy groups is preferably 1 to 10 and more preferably in a range of 2 to 8. Here, the number of terminal hydroxy groups in the oxyalkylene group is not included in the number of hydroxy groups.

The anionic surfactant having a POA group is not particularly limited, and examples thereof include polyoxyalkylene alkyl ether carboxylates, polyoxyalkylene alkyl sulfosuccinates, polyoxyalkylene alkyl ether sulfuric acid ester salts, alkyl phenoxy polyoxyalkylene propyl sulfonates, polyoxyalkylene alkyl sulfophenyl ethers, polyoxyalkylene aryl ether sulfuric acid ester salts, polyoxyalkylene polycyclic phenylether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, and polyoxyalkylene perfluoroalkyl ether phosphoric acid ester salts.

The anionic surfactant having a hydroxy group is not particularly limited, and examples thereof include hydroxy carboxylates, hydroxy alkyl ether carboxylates, hydroxy alkane sulfonates, fatty acid monoglyceride sulfuric acid ester salts, and fatty acid monoglyceride acid ester salts.

The content of the surfactant having a POA group or a hydroxy group is preferably in a range of 0.05% by mass to 15% by mass and more preferably in a range of 0.1% by mass to 10% by mass with respect to the total mass of the image recording layer.

Hereinafter, specific examples of the surfactant having a POA group or a hydroxy group will be described, but the present disclosure is not limited thereto. A surfactant A-12 described below is a trade name of Zonyl FSP and available from Dupont. Further, a surfactant N-11 described below is a trade name of Zonyl FSO 100 and available from Dupont. Further, m and n in A-12 each independently represent an integer of 1 or greater.

A-1

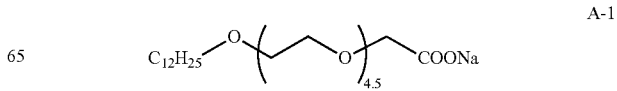

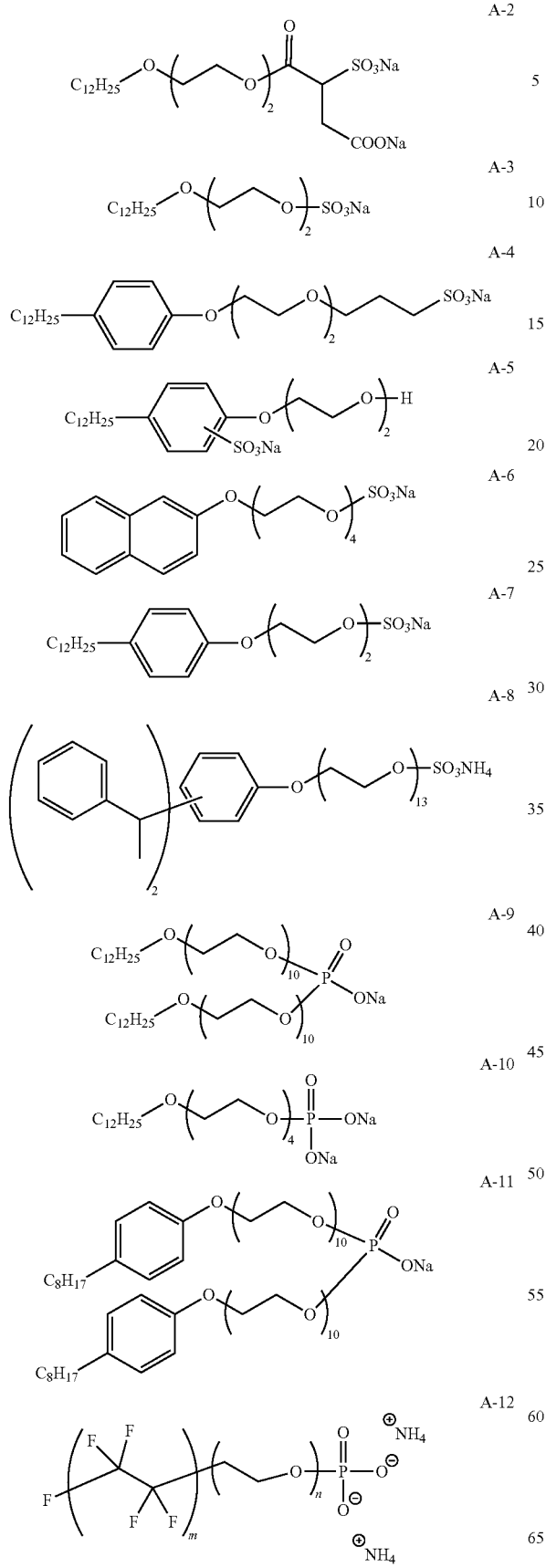
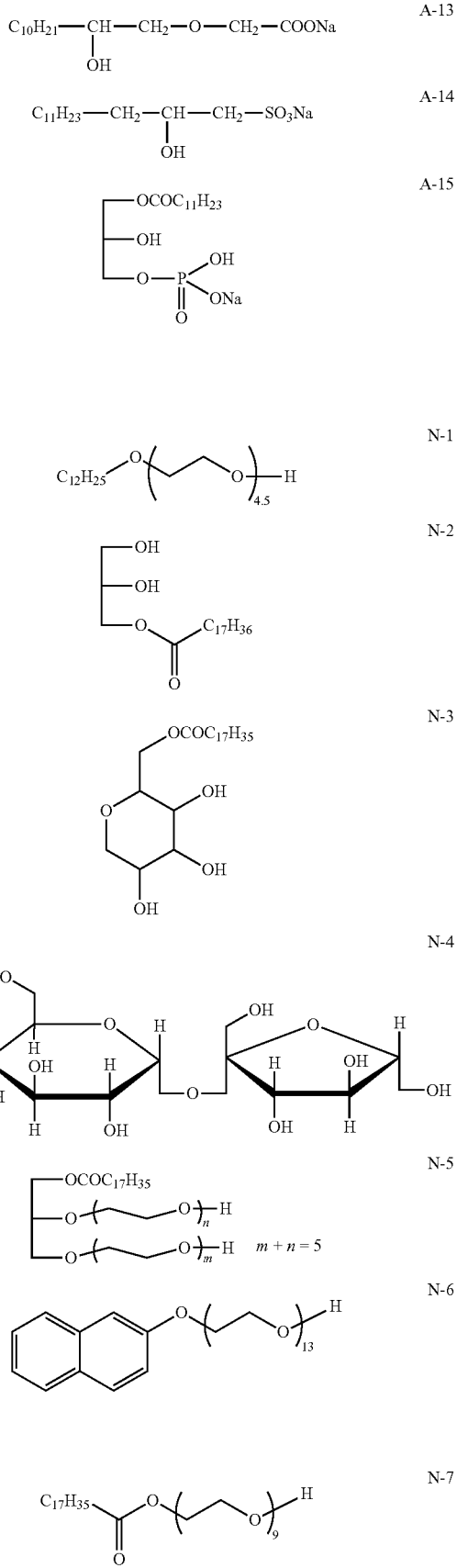

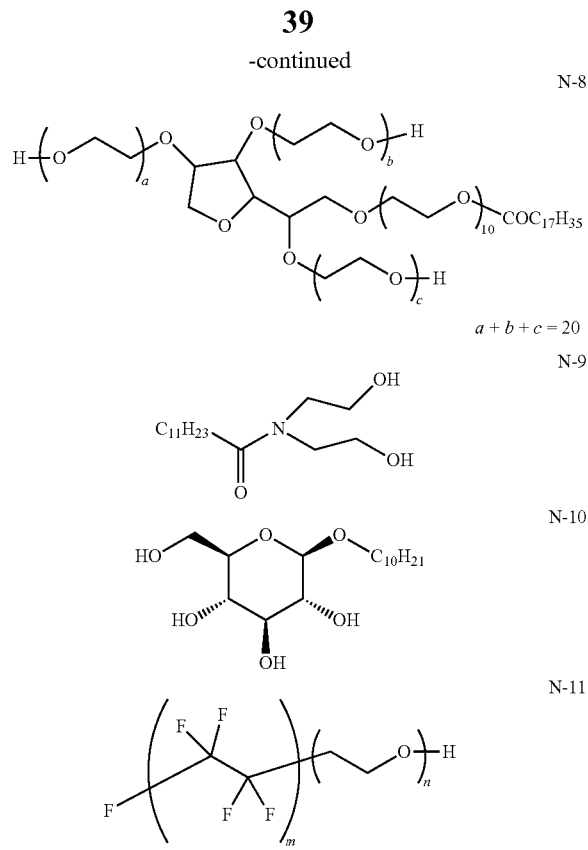

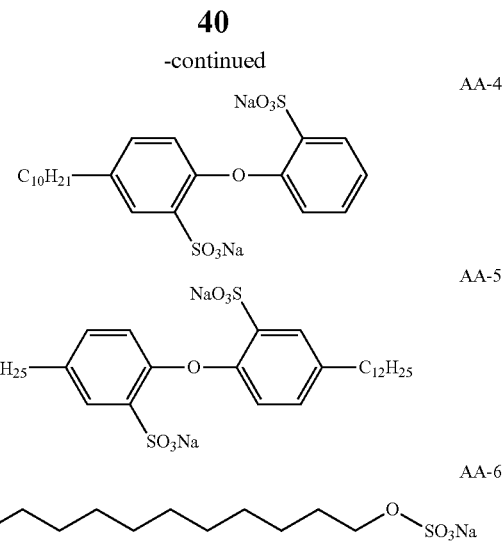

For the purpose of ensuring coating uniformity of the image recording layer, the image recording layer may contain an anionic surfactant that does not have a polyoxyalkylene group or a hydroxy group.

The anionic surfactant is not particularly limited as long as the above-described purpose is achieved. Among the examples of the anionic surfactants, alkyl benzene sulfonic acid or a salt thereof, alkyl naphthalene sulfonic acid or a salt thereof, (di)alkyl diphenyl ether (di)sulfonic acid or a salt thereof, or alkyl sulfuric acid ester salt is preferable.

The addition amount of the anionic surfactant that does not have a polyoxyalkylene group or a hydroxy group is preferably in a range of 1% by mass to 50% by mass and more preferably in a range of 1% by mass to 30% by mass with respect to the total mass of the surfactant which has a polyoxyalkylene group or a hydroxy group.

Hereinafter, specific examples of the anionic surfactant that does not have a polyoxyalkylene group or a hydroxy group will be described, but the present disclosure is not limited thereto.

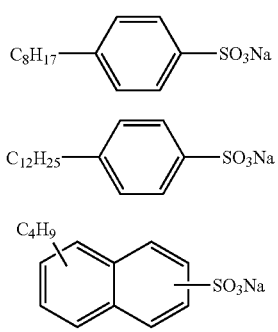

Further, for the purpose of coating uniformity of the image recording layer, a non-ionic surfactant that does not have a polyoxyalkylene group or a hydroxy group or a fluorine surfactant may be used. For example, fluorine surfactants described in JP1987-170950A (JP-S62-170950A) are preferably used.

The image recording layer may contain a hydrophilic resin. Preferred examples of the hydrophilic resin include resins having hydrophilic groups such as a hydroxy group, a hydroxyethyl group, a hydroxypropyl group, an amino group, an aminoethyl group, an aminopropyl group, a carboxy group, a carboxylate group, a sulfo group, a sulfonate group, and a phosphoric acid group.

Specific examples of the hydrophilic resin include gum Arabic, casein, gelatin, a starch derivative, carboxy methyl cellulose and sodium salt thereof, cellulose acetate, sodium alginate, vinyl acetate-maleic acid copolymers, styrene-maleic acid copolymers, polyacrylic acids and salts of these, polymethacrylic acids and salts of these, a homopolymer and a copolymer of hydroxy ethyl methacrylate, a homopolymer and a copolymer of hydroxy ethyl acrylate, a homopolymer and a copolymer of hydroxy propyl methacrylate, a homopolymer and a copolymer of hydroxy propyl acrylate, a homopolymer and a copolymer of hydroxy butyl methacrylate, a homopolymer and a copolymer of hydroxy butyl acrylate, polyethylene glycols, hydroxy propylene polymers, polyvinyl alcohols, hydrolyzed polyvinyl acetate having a degree of hydrolysis of preferably at least 60% and more preferably at least 80%, polyvinyl formal, polyvinyl butyral, polyvinylpyrrolidone, a homopolymer and a copolymer of acrylamide, a homopolymer and a copolymer of methacrylamide, and a homopolymer and a copolymer of N-methylol acrylamide.

The weight-average molecular weight of the hydrophilic resin is preferably 2,000 or greater from the viewpoints of obtaining sufficient coated-film strength or printing durability.

The content of the hydrophilic resin is preferably in a range of 0.5% by mass to 50% by mass and more preferably in a range of 1% by mass to 30% by mass with respect to the total mass of the image recording layer.

The image recording layer may contain inorganic particles other than those for forming unevenness described above. Preferred examples of the inorganic particles include silica, alumina, magnesium oxide, titanium oxide, magnesium carbonate, calcium alginate, and a mixture of these.

The inorganic particles can be used for the purpose of improving coated-film strength.

The average particle diameter of the inorganic particles is preferably in a range of 5 nm to 10 µm and more preferably in a range of 10 nm to 1 µm. In a case where the average particle diameter thereof is in the above described range, the thermoplastic polymer particles are stably dispersed, the film hardness of the image recording layer is sufficiently held, and a non-image area with excellent hydrophilicity in which printing stain is unlikely to occur can be formed.

The inorganic particles are available as commercially available products such as a colloidal silica dispersion and the like.

The content of the inorganic particles is preferably in a range of 1.0% by mass to 70% by mass and more preferably in a range of 5.0% by mass to 50% by mass with respect to the total mass of the image recording layer.

The image recording layer may contain a plasticizer in order to provide flexibility for a coated film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The content of the plasticizer is preferably in a range of 0.1% by mass to 50% by mass and more preferably in a range of 1% by mass to 30% by mass with respect to the total mass of the image recording layer.

In a case where polymer particles having a thermally reactive functional group (cross-linking group) are used for the image recording layer, a compound that starts or promotes a reaction of the thermally reactive functional group (cross-linking group) can be added to the image recording layer as necessary. As the compound that starts or promotes a reaction of the thermally reactive functional group, a compound that generates a radical or a cation by heating may be exemplified. Examples of the compound include a lophine dimer, a trihalomethyl compound, a peroxide, an azo compound, onium salts including diazonium salts and diphenyl iodonium salts, acyl phosphine, and imide sulfonate. The amount of the compound to be added to the image recording layer is preferably in a range of 1% by mass to 20% by mass and more preferably in a range of 1% by mass to 10% by mass with respect to the total mass of the image recording layer. In a case where the amount thereof is in the above-described range, the on-press developability is not degraded and excellent effects for starting or promoting a reaction are obtained.

<<Formation of Image Recording Layer C>>

The image recording layer C is formed by dissolving or dispersing each of the above-described required components in a suitable solvent to prepare a coating solution, coating an aluminum support with the coating solution directly or through an undercoat layer. As the solvent, water or a mixed solvent of water and an organic solvent is used, and a mixed solvent of water and an organic solvent is preferable from the viewpoint of the excellent surface state after coating. Since the amount of the organic solvent varies depending on the type of organic solvent, the amount thereof cannot be specified unconditionally, but the amount of the organic solvent in the mixed solvent is preferably in a range of 5% by volume to 50% by volume. Here, it is necessary that the amount of the organic solvent to be used is set such that the thermoplastic polymer particles are not aggregated. The concentration of solid contents of the image recording layer coating solution is preferably in a range of 1% by mass to 50% by mass.

As the organic solvent used as a solvent of the coating solution, a water-soluble organic solvent is preferable. Specific examples thereof include an alcohol solvent such as methanol, ethanol, propanol, isopropanol, or 1-methoxy-2-propanol, a ketone solvent such as acetone or methyl ethyl ketone, a glycol ether solvent such as ethylene glycol dimethyl ether, y-butyrolactone, N,N-dimethylformamide, N,N-dimethylacetamide, tetrahydrofuran, and dimethylsulfoxide. Particularly, an organic solvent having a boiling point of 120° C. or lower and a solubility (amount of a solvent to be dissolved in 100 g of water) of 10 g or greater in water is preferable and an organic solvent having a solubility of 20 g or greater is more preferable.

As a coating method of the image recording layer coating solution, various methods can be used. Examples of the methods include a bar coater coating method, a rotary coating method, a spray coating method, a curtain coating method, a dip coating method, an air knife coating method, a blade coating method, and a roll coating method. The coating amount (solid content) of the image recording layer on the aluminum support obtained after the coating and the drying varies depending on the purpose thereof, but is preferably in a range of 0.5 g/m$^2$ to 5.0 g/m$^2$ and more preferably in a range of 0.5 g/m$^2$ to 2.0 g/m$^2$.

Hereinafter, other constituent elements of the lithographic printing plate precursor will be described.

<Undercoat Layer>

The lithographic printing plate precursor according to the present disclosure may be provided with an undercoat layer between the image recording layer and the aluminum support as necessary. Since bonding of the aluminum support to the image recording layer becomes stronger in an exposed portion and the aluminum support is easily separated from the image recording layer in an unexposed portion, the undercoat layer contributes to improvement of the on-press developability without degrading the printing durability. Further, in a case of infrared laser (IR) exposure, the undercoat layer functions as a heat insulating layer so that a degradation in sensitivity due to heat, generated by exposure, being diffused in the aluminum support is prevented.

Examples of eth compound used for the undercoat layer include a silane coupling agent having an ethylenic double bond reaction group, which can be added and polymerized, described in JP1998-282679A (JP-H10-282679A); and a phosphorous compound having an ethylenic double bond reaction group described in JP1990-304441A (JP-H02-304441A). Preferred examples thereof include polymer compounds having an adsorptive group which can be adsorbed to the surface of the aluminum support, a hydrophilic group, and a cross-linking group, as described in JP2005-125749A and JP2006-188038A. As such a polymer compound, a copolymer of a monomer having an adsorptive group, a monomer having a hydrophilic group, and a monomer having a cross-linking group is preferable. Specific examples thereof include a copolymer of a monomer having an adsorptive group such as a phenolic hydroxy group, a carboxy group, —PO$_3$H$_2$, —OPO$_3$H$_2$, —CONHSO$_2$—, —SO$_2$NHSO$_2$—, or —COCH$_2$COCH$_3$, a monomer having a hydrophilic group such as a sulfo group, and a monomer having a polymerizable cross-linking group such as a methacryl group or an allyl group. The polymer compound may include a cross-linking group introduced by forming salts between a polar substituent of the polymer compound and a compound that includes a substituent having the opposite charge and an ethylenically unsaturated bond. Further, monomers other than the monomers described above, preferably hydrophilic monomers may be further copolymerized.

The content of the ethylenically unsaturated bond in the polymer compound for an undercoat layer is preferably in a range of 0.1 to 10.0 mmol and more preferably in a range of 2.0 to 5.5 mmol with respect to 1 g of the polymer compound.

The weight-average molecular weight of the polymer compound for an undercoat layer is preferably 5,000 or greater and more preferably in a range of 10,000 to 300,000.

For the purpose of preventing stain over time, the undercoat layer may contain a chelating agent, a secondary or tertiary amine, a polymerization inhibitor, an amino group, a compound that includes an amino group or a functional group having polymerization inhibiting ability and a group interacting with the surface of an aluminum support, and the like (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount of the undercoat layer after being dried is preferably in a range of 0.1 mg/m$^2$ to 100 mg/m$^2$ and more preferably in a range of 1 mg/m$^2$ to 30 mg/m$^2$.

<Overcoat Layer>

It is preferable that the lithographic printing plate precursor according to the present disclosure includes an overcoat layer containing a water-soluble polymer.

In the present disclosure, the water-soluble polymer is a polymer compound in which 1 g or greater thereof is dissolved in 100 g of water at 25° C., and it is preferable that the water-soluble polymer is a polymer compound in which 5 g or greater thereof is dissolved in 100 g of water at 25° C. and more preferable that the water-soluble polymer is a polymer compound in which 10 g or greater thereof is dissolved in 100 g of water at 25° C.

Further, in the present disclosure, a polymer indicates a compound having a weight-average molecular weight of 1000 or greater.

From the viewpoints of the scratch resistance, on-press developability, and suppression of on-press development scum, the C Log P value of the water-soluble polymer is preferably in a range of −3 to 1, more preferably in a range of −0.6 to 0.8, and particularly preferably in a range of −0.6 to 0.4.

The C log P value is a value acquired by calculating a common logarithm log P of a distribution coefficient P to 1-octanol and water. As the method used for calculating the C log P value or the software, known methods and software can be used. Further, unless otherwise specified, a C log P program incorporated in ChemBioDraw Ultra 12.0 (manufactured by Cambridge Soft Corporation) is set to be used in the present disclosure.

It is preferable that the water-soluble polymer has at least one repeating unit selected from the group consisting of a structure containing a hydroxy group, a structure containing a pyrrolidone ring, and a structure containing an oxyalkylene group, which have an affinity particularly for water and more preferable that the water-soluble polymer has a structure containing an oxyalkylene group as a constitutional repeating unit.

Specific examples of the water-soluble polymer containing a hydroxy group include gum arabic, soya gum, carboxymethyl cellulose, hydroxymethyl cellulose, hydroxyethyl cellulose, polyhydroxyethylated cellulose, hydroxypropyl cellulose, hydroxypropylmethyl cellulose, glyoxalated hydroxypropylmethyl cellulose, hydroxypropylmethyl cellulose phthalate, methyl cellulose, and polyvinyl alcohol.

Specific examples of the water-soluble polymer containing a pyrrolidone ring include polyvinylpyrrolidone and a copolymer of vinylpyrrolidone and vinyl acetate.

Specific suitable examples of the water-soluble polymer containing an oxyalkylene group include polyalkylene glycol such as polyethylene glycol, polypropylene glycol, or polyoxyethylene polyoxypropylene glycol (also referred to as a polyoxyethylene-polyoxypropylene condensate), polyglycerin or an ether thereof such as poly(ethylene glycol)methyl ether, poly(ethylene glycol)phenyl ether, polyoxyalkylene monoalkyl or aryl ether, polyoxyethylene polyoxypropylene alkyl ether, polyglycerin, polyoxyethylene glycerin, or polyoxyethylene polyoxypropylene glyceryl ether, polyoxyethylene monoester, and polyoxyethylene alkyl ether ester.

Among these, it is preferable that the water-soluble polymer contains polysaccharides and more preferable that the water-soluble polymer contains a cellulose compound from the viewpoints of scratch resistance, on-press developability, and suppression of on-press development scum.

The polysaccharides are not particularly limited as long as the polysaccharides have water solubility, and examples thereof include polysaccharides, polysaccharide derivatives, and alkali metal salts of these.

The cellulose compound in the present disclosure is a compound having water solubility, and a compound in which a part of cellulose is modified is preferable as the cellulose compound.

As the cellulose compound, a compound obtained by substituting at least a part of a hydroxyl group of cellulose with at least one selected from the group consisting of an alkyl group and a hydroxyalkyl group is preferably exemplified.

As the cellulose compound, an alkyl cellulose compound or a hydroxyalkyl cellulose compound is preferable, and a hydroxyalkyl cellulose compound is more preferable.

As the alkyl cellulose compound, methyl cellulose is preferably exemplified.

As the hydroxyalkyl cellulose compound, hydroxypropyl cellulose is preferably exemplified.

As the water-soluble polymer, from the viewpoints of scratch resistance, on-press developability, and suppression of on-press development scum, at least one water-soluble polymer selected from the group consisting of a cellulose compound, polyvinyl alcohol (PVA), polyvinylpyrrolidone (PVP), and polyethylene glycol (PEG) is preferable, at least one water-soluble polymer selected from the group consisting of PVA, PVP, and methyl cellulose is more preferable, and methyl cellulose is particularly preferable.

The weight-average molecular weight (Mw) of the water-soluble polymer used in the present disclosure can be optionally set according to the performance design for a lithographic printing plate precursor.

From the viewpoints of scratch resistance, on-press developability, and suppression of on-press development scum, the weight-average molecular weight (Mw) of the water-soluble polymer is preferably in a range of 1000 to 200000, more preferably in a range of 3000 to 100000, and still more preferably in a range of 5000 to 70000. In a case where the weight-average molecular weight thereof is in the above-described range, the on-press developability and scratch resistance are excellent. The weight-average molecular weight (Mw) of the water-soluble polymer compound can be measured according to a gel permeation chromatography (GPC) method using polyethylene glycol as a standard substance.

Further, the overcoat layer may contain one or two or more water-soluble polymers.

From the viewpoints of scratch resistance, on-press developability, and suppression of on-press development scum, the total content of the particles and the water-soluble polymer in the overcoat layer is preferably 50% by mass or greater, more preferably 80% by mass or greater, still more preferably 90% by mass or greater, particularly preferably 95% by mass or greater, and most preferably 99% by mass or greater.

The overcoat layer may further contain other components. Examples of other components include particles.

As the particles, organic wax particles are preferably exemplified.

As the organic wax particles, AQUAMAT263, AQUAMAT272, AQUACER537, and the like which can be commercially purchased from BYK Additives & Instruments can be suitably used.

Further, it is also preferable that the particles are particles containing fluorinated and non-fluorinated polyolefin, for example, fluorinated or non-fluorinated hydrocarbon containing low-density polyethylene, high-density polyethylene, polypropylene, polytetrafluoroethylene, or a mixture of these.

From the viewpoints of the scratch resistance, the developability, and suppression of on-press development scum, the volume average particle diameter of the particles is preferably 0.7 µm, more preferably in a range of 0.75 µm to 50 µm, still more preferably in a range of 5 µm to 50 µm, and particularly preferably in a range of 9 µm to 50 µm.

In the present disclosure, the volume average particle diameter of the particles is calculated according to a laser light scattering method.

From the viewpoints of the scratch resistance, the developability, and suppression of the on-press development scum, the content of the particles in the overcoat layer is preferably in a range of 10% by mass to 95% by mass, more preferably in a range of 30% by mass to 95% by mass, and particularly preferably in a range of 40% by mass to 70% by mass with respect to the total mass of the overcoat layer.

<Protective Layer>

In the lithographic printing plate precursor, according to the present disclosure, a protective layer may be provided between the image recording layer and the overcoat layer as necessary. The protective layer has a function of suppressing a reaction of inhibiting image formation through oxygen blocking, a function of preventing generation of damage to the image recording layer, and a function of preventing ablation at the time of high illuminance laser exposure.

As the protective layer having such functions, a protective layer described in paragraphs 0202 to 0204 of JP2014-104631A can be used.

The protective layer is applied according to a known method. The coating amount of the protective layer after the drying is preferably in a range of 0.01 g/m² to 10 g/m², more preferably in a range of 0.02 g/m² to 3 g/m², and particularly preferably in a range of 0.02 g/m² to 1 g/m².

<Method of Preparing Lithographic Printing Plate Precursor>

The lithographic printing plate precursor can be produced by applying a coating solution of each configuration layer according to a typical method and performing drying to form each configuration layer.

The coating solution of each configuration layer is prepared by dissolving components contained in each configuration layer in known solvents.

The application is performed according to a die coating method, a dip coating method, an air knife coating method, a curtain coating method, a roller coating method, a wire bar coating method, a gravure coating method, or a slide coating method.

Further, it is preferable that the overcoat layer is formed using an aqueous coating solution that contains the particles and the water-soluble polymer.

(Method of Preparing Lithographic Printing Plate and Lithographic Printing Method)

A lithographic printing plate can be prepared by image-exposing the lithographic printing plate precursor according to the present disclosure and performing a development treatment thereon.

An aspect of the method of preparing a lithographic printing plate according to the present disclosure includes a step (exposure step) of imagewise-exposing the lithographic printing plate precursor according to the present disclosure; and a step (on-press development step) of supplying at least one of a printing ink or dampening water and removing the image recording layer in a non-image area on a printing press.

An aspect of the lithographic printing method according to the present disclosure includes a step (exposure step) of imagewise-exposing the lithographic printing plate precursor according to the present disclosure; a step of supplying at least any of printing ink or dampening water and removing a non-image area of the image recording layer on a printing press to prepare a lithographic printing plate, and a step of performing printing using the obtained lithographic printing plate.

Hereinafter, preferable aspects of each step in the method of preparing a lithographic printing plate according to the present disclosure and the lithographic printing method according to the present disclosure will be sequentially described. Further, the lithographic printing plate precursor according to the present disclosure can be developed by a developer.

In addition, the preferable aspects of the exposure step and the on-press development step in the method of preparing a lithographic printing plate according to the present disclosure are the same as the preferable aspects of the exposure step and the on-press development step in the lithographic printing method according to the present disclosure.

<Exposure Step>

It is preferable that the method of preparing a lithographic printing plate of the present disclosure includes an exposure step of imagewise-exposing the lithographic printing plate precursor of the present disclosure to form an image area and a non-mage area.

It is preferable that the lithographic printing plate precursor is a lithographic printing plate precursor for on-press development.

In a case where the lithographic printing plate precursor is a negative type lithographic printing plate precursor, the exposed region (exposed portion) becomes an image area and the unexposed region (unexposed portion) becomes a non-image area.

In the exposure step, it is preferable that the lithographic printing plate precursor according to the present disclosure is exposed to a laser through a transparent original picture having a line image, a halftone dot image, and the like or imagewise-exposed by performing laser beam scanning using digital data.

The wavelength of a light source is preferably in a range of 750 nm to 1,400 nm. As the light source having a wavelength of 750 nm to 1,400 nm, a solid-state laser or a semiconductor laser that radiates infrared rays is suitable. The output of the infrared laser is preferably 100 mW or greater, the exposure time per one pixel is preferably less than 20 microseconds, and the irradiation energy quantity is preferably in a range of 10 mJ/cm$^2$ to 300 mJ/cm$^2$. For the purpose of reducing the exposure time, it is preferable to use a multi-beam laser device. The exposure mechanism may be any of an internal drum system, an external drum system, and a flat bed system.

The image exposure can be performed using a plate setter according to a conventional method. In a case of the on-press development, the lithographic printing plate precursor is mounted on the printing press, and image exposure may be performed on the printing press.

<On-Press Development Step>

It is preferable that the method of preparing a lithographic printing plate of the present disclosure includes the on-press development step of supplying at least one of a printing ink or dampening water and removing the unexposed portion.

Further, the method of preparing a lithographic printing plate of the present disclosure may be performed using a method (developer treatment system) of performing development in a developer.

Hereinafter, the on-press development system will be described.

[On-Press Development System]

In the on-press development system, it is preferable that a lithographic printing plate is prepared using the image-exposed lithographic printing plate precursor by supplying ink and an aqueous component on a printing press and removing an image recording layer in a non-image area.

As the ink, oily ink is used, and the oily ink includes ultraviolet curable ink other than the aqueous ink.

In other words, in a case where the lithographic printing plate precursor is image-exposed and then mounted on the printing press without performing any development treatment or the lithographic printing plate precursor is mounted on the printing press, image-exposed on the printing press, and printed by supplying at least any of ink or an aqueous component (for example, a composition used as dampening water), the image recording layer in the non-image area is removed by being dissolved or dispersed due to at least any of the supplied ink or aqueous component in the non-image area at an initial stage of the printing, and a hydrophilic surface is exposed to the portion. In addition, in the image area, the image recording layer cured due to exposure forms an ink receiving portion having a lipophilic surface. The ink or the aqueous component may be initially supplied to the plate surface, but it is preferable that the ink is initially supplied to the plate surface from the viewpoint of preventing occurrence of stain due to components of the image recording layer from which the aqueous component has been removed. In this manner, the lithographic printing plate precursor is subjected to on-press development on the printing press and used as it is for a plurality of sheets of printing. As the ink and the aqueous component, typical printing ink for lithographic printing and dampening water are suitably used.

<Printing Step>

The lithographic printing method according to the present disclosure includes a step of performing printing using the lithographic printing plate obtained in the on-press development step.

Specifically, this step is a step of performing printing on a recording medium by supplying printing ink to the obtained lithographic printing plate.

The printing ink is not particularly limited, and various known inks can be used as desired. Further, an oily ink is preferably exemplified as the printing ink.

Further, in the printing step, dampening water may be supplied as necessary.

Further, the printing step may be performed continuously after the on-press development step without stopping the printing press.

The recording medium is not particularly limited, and a known recording medium can be used as desired.

In the method of preparing a lithographic printing plate obtained from the lithographic printing plate precursor of the present disclosure and the lithographic printing method of the present disclosure, the entire surface of the lithographic printing plate precursor may be heated before exposure, during exposure, or between exposure and development as necessary.

In a case where the entire surface thereof is heated, the image forming reaction in the image recording layer is promoted so that the sensitivity or the printing durability is improved and the sensitivity is stabilized. It is preferable that the heating before development is performed under a mild temperature condition of 150° C. or lower. With the above-described aspect, a problem of a non-image area being cured can be prevented. It is preferable that extremely strong conditions are used for the heating after development, and the temperature is preferably in a range of 100° C. to 500° C. In a case where the temperature is in the above-described range, an image-strengthening action is sufficiently obtained, and deterioration of the support and thermal decomposition of the image area can be suppressed.

EXAMPLES

Hereinafter, the present disclosure will be described in detail with reference to examples, but the present disclosure is not limited thereto. In the present examples, "%" and "part" respectively indicate "% by mass" and "part by mass" unless otherwise specified. Further, in a polymer compound, the molecular weight indicates the weight-average molecular weight (Mw) and the proportion of repeating constitutional units indicates mole percentage unless otherwise specified. Further, the weight-average molecular weight (Mw) is a value in terms of polystyrene obtained by performing measurement using gel permeation chromatography (GPC).

Examples 1 to 22 and Comparative Examples 1 to 14

<Preparation of Aluminum Support>

An aluminum plate (aluminum alloy plate, material 1S) having a thickness of 0.3 mm was subjected to any of the following treatment A or B, thereby producing an aluminum support. Moreover, during all treatment steps, a washing treatment was performed, and liquid cutting was performed using a nip roller after the washing treatment.

[Treatment A]

(A-a) Mechanical Roughening Treatment (Brush Grain Method)

Figure 4:
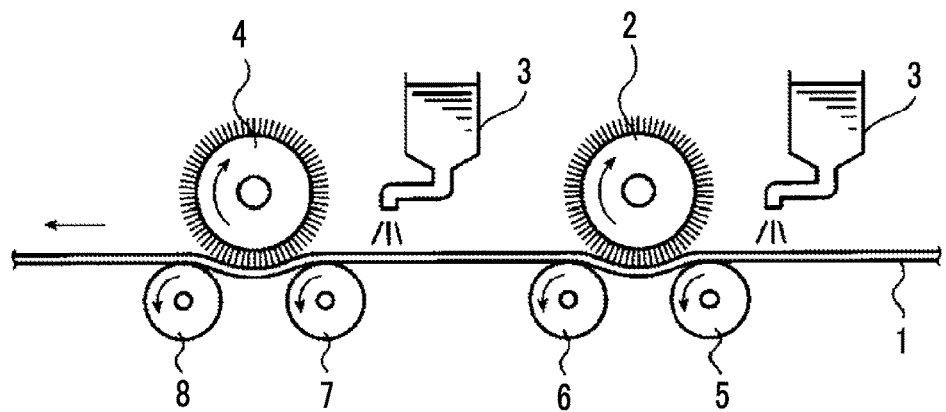
FIG. 4 is a side view illustrating the concept of a step of brush graining used for a mechanical roughening treatment in preparation of the aluminum support according to the present disclosure.

While supplying a suspension of pumice (specific gravity of 1.1 g/cm$^3$) to the surface of an aluminum plate as a polishing slurry liquid using a device illustrated in FIG. 4, a mechanical roughening treatment was performed using rotating bundle bristle brushes. In FIG. 4, the reference numeral 1 represents an aluminum plate, the reference numerals 2 and 4 represent roller-like brushes (in the present examples, bundle bristle brushes), the reference numeral 3 represents a polishing slurry liquid, and the reference numerals 5, 6, 7, and 8 represent a support roller.

The mechanical roughening treatment is performed under conditions in which the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having a diameter of 300 mm. The distance between two support rollers (a diameter of 200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(A-b) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved was 10 g/m$^2$.

(A-c) Desmutting Treatment Using Acidic Aqueous Solution

Next, a desmutting treatment was performed using a nitric acid aqueous solution. Specifically, the desmutting treatment was performed by spraying the nitric acid aqueous solution to the aluminum plate for 3 seconds using a spray. As the nitric acid aqueous solution used for the desmutting treatment, a waste liquid of nitric acid used for the subsequent electrochemical roughening treatment step was used. The liquid temperature was 35° C.

(A-d) Electrochemical Roughening Treatment

Figure 5:
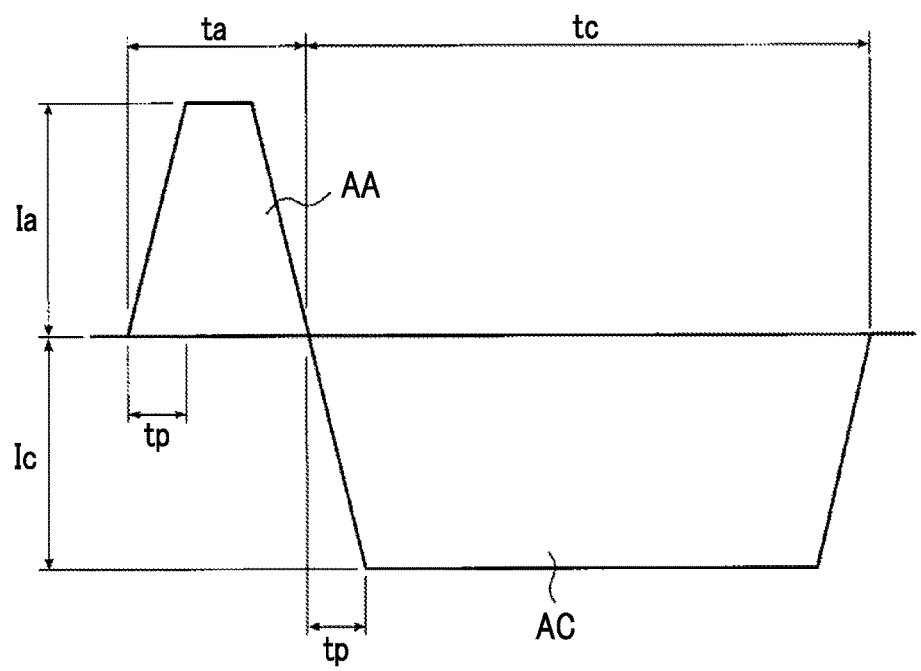
FIG. 5 is a graph showing an alternating waveform current waveform diagram used for an electrochemical roughening treatment according to a method of producing an aluminum support used in the present disclosure.

An electrochemical roughening treatment was continuously performed using an AC voltage of 60 Hz in nitric acid electrolysis. As an electrolytic solution at this time, an electrolytic solution which had been adjusted to have a concentration of aluminum ions of 4.5 g/L by adding aluminum nitrate to a nitric acid aqueous solution having a concentration of 10.4 g/L at a liquid temperature of 35° C. was used. The AC power source waveform is a waveform illustrated in FIG. 5. Further, using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. In FIG. 5, AA indicates the current of the aluminum plate during the anodic reaction and AC indicates the current of the aluminum plate during the cathodic reaction. As an auxiliary anode, ferrite was used. An electrolytic cell illustrated in FIG. 6 was used as the electrolytic cell. The current density was 30 A/dm$^2$ in terms of the peak current value, and 5% of the current from the power source was allowed to separately flow to the auxiliary anode. The electric quantity (C/dm$^2$) was adjusted to be the value listed in Table 1 as the total electric quantity during the anodization of the aluminum plate. For example, in Example 1, the electric quantity was 185 C/dm$^2$. Thereafter, washing with water by spraying was performed.

(A-e) Alkali Etching Treatment

The aluminum plate obtained in the above-described manner was subjected to an etching treatment by spraying a caustic soda aqueous solution in which the concentration of caustic soda was 27% by mass and the concentration of aluminum ions was 2.5% by mass using a spray tube at a temperature of 50° C. Thereafter, washing with water by spraying was performed. Further, the amount of aluminum to be dissolved was adjusted to be the value listed in Table 1. For example, in Example 1, the value was 3.5 g/m$^2$.

(A-f) Desmutting Treatment in Acidic Aqueous Solution

Next, a desmutting treatment was performed in a sulfuric acid aqueous solution. Specifically, the desmutting treatment was performed by spraying the sulfuric acid aqueous solution to the aluminum plate for 3 seconds using a spray. As the sulfuric acid aqueous solution used for the desmutting treatment, an aqueous solution having a sulfuric acid concentration of 170 g/L and an aluminum ion concentration of 5 g/L was used. The liquid temperature was 30° C.

Figure 6:
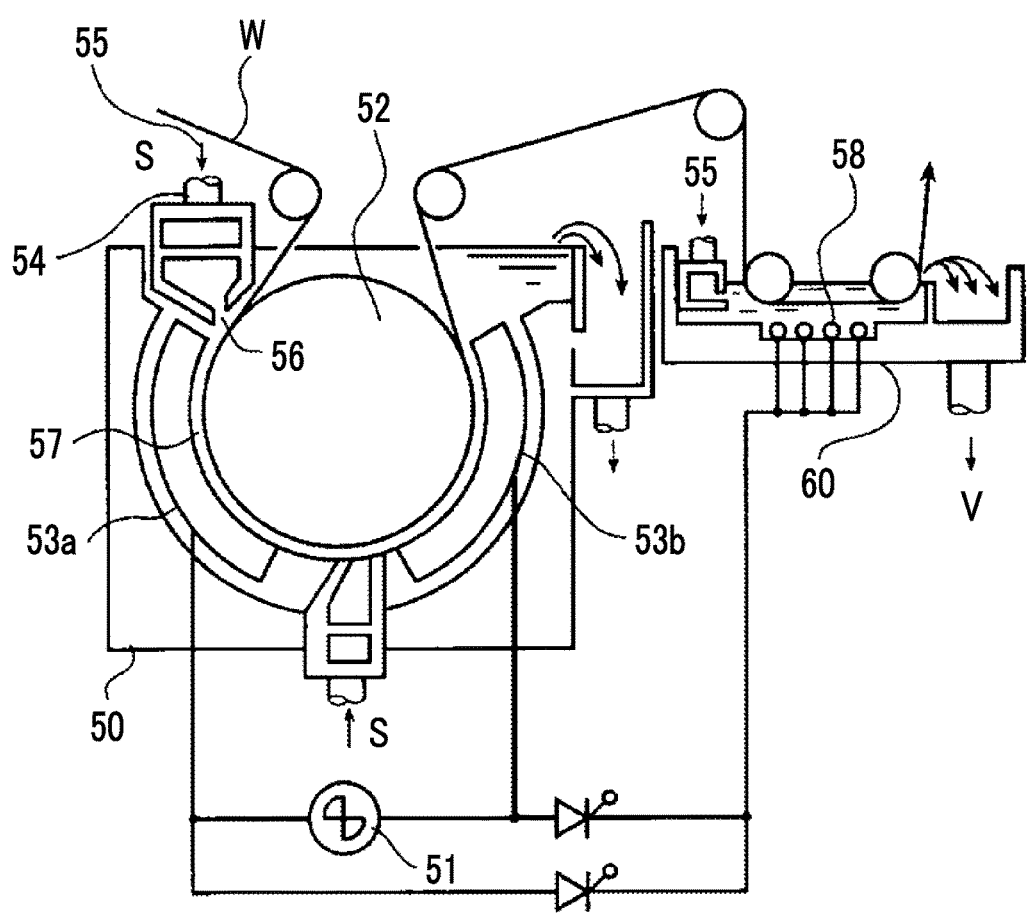
FIG. 6 is a side view illustrating an example of a radial type cell in the electrochemical roughening treatment carried out using the alternating current according to the method of producing an aluminum support used in the present disclosure.

(A-g) Electrochemical Roughening Treatment Using Hydrochloric Acid Aqueous Solution An electrochemical roughening treatment was continuously performed using an AC voltage of 60 Hz in hydrochloric acid electrolysis. As an electrolytic solution, an electrolytic solution which had been adjusted to have a concentration of aluminum ions of 4.5 g/L by adding aluminum chloride to an aqueous solution having 6.2 g/L of hydrochloric acid at a liquid temperature of 35° C. was used. The AC power source waveform is a waveform illustrated in FIG. 5. Further, using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. An electrolytic cell illustrated in FIG. 6 was used as the electrolytic cell. In FIG. 6, the arrow indicated by S indicates the orientation of the absorbed liquid, and an electrolytic solution discharge port is present at the position directed by the arrow indicated by V. The current density was 25 A/dm$^2$ in terms of the peak current value, and the electric quantity (C/dm$^2$) in the hydrochloric acid electrolysis was 63 C/dm$^2$ as the total electric quantity at the time of anodization of the aluminum plate. Thereafter, washing with water was performed using a spray.

(A-h) Alkali Etching Treatment

The aluminum plate obtained in the above-described manner was subjected to an etching treatment by spraying a caustic soda aqueous solution in which the concentration of caustic soda was 5% by mass and the concentration of aluminum ions was 0.5% by mass using a spray at a temperature of 60° C. Thereafter, washing with water by spraying was performed. The amount of aluminum to be dissolved was 0.2 g/m$^2$.

(A-i) Desmutting Treatment Using Acidic Aqueous Solution

Next, a desmutting treatment was performed using a sulfuric acid aqueous solution. Specifically, the desmutting treatment was performed by spraying the sulfuric acid aqueous solution to the aluminum plate for 3 seconds using a spray. As the sulfuric acid aqueous solution used for the desmutting treatment, a waste liquid generated in the anodization treatment step (an aqueous solution having a sulfuric acid concentration of 170 g/L and an aluminum ion concentration of 5 g/L) was used. The liquid temperature was 35° C.

(A-j) Anodization Treatment

Figure 7:
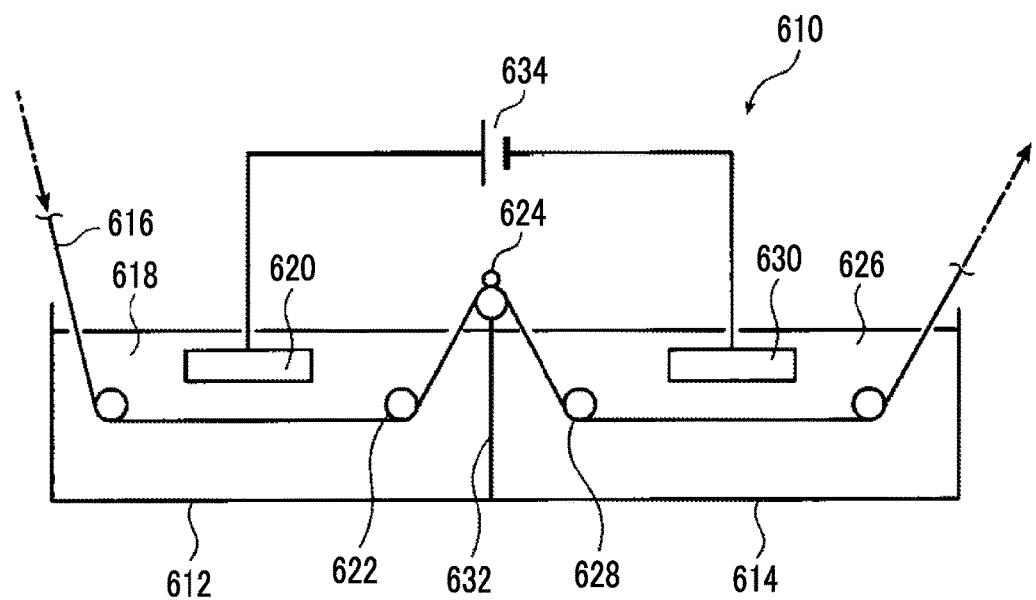
FIG. 7 is a schematic view illustrating an anodizing device used for an anodization treatment in preparation of an aluminum support used in the present disclosure.

An anodization treatment was performed with an anodizing device using DC electrolysis and having a structure illustrated in FIG. 7. An anodized film having a predetermined coating amount was formed by performing an anodization treatment under conditions in the columns of "anodization treatment" listed in Table 1.

An aluminum plate 616 in an anodization treatment device 610 is transported as indicated by the arrow in FIG. 7. The aluminum plate 616 is positively (+) charged by a power supply electrode 620 in a power supply tank 612 in which an electrolytic solution 618 is stored. Further, the aluminum plate 616 is transported upward by a roller 622 in the power supply tank 612, redirected downward by a nip roller 624, transported toward an electrolytic treatment tank 614 in which an electrolytic solution 626 is stored, and redirected to the horizontal direction by a roller 628. Next, the aluminum plate 616 is negatively (−) charged by an electrolytic electrode 630 so that an anodized film is formed on the surface thereof, and the aluminum plate 616 coming out of the electrolytic treatment tank 614 is transported to the next step. In the anodization treatment device 610, direction changing means is formed of the roller 622, the nip roller 624, and the roller 628. The aluminum plate 616 is transported in a mountain shape and an inverted U shape by the roller 622, the nip roller 624, and the roller 628 in an inter-tank portion between the power supply tank 612 and the electrolytic treatment tank 614. The power supply electrode 620 and the electrolytic electrode 630 are connected to a DC power source 634.

(A-k) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at a temperature listed in Table 1 under a time condition listed in Table 1. Thereafter, washing with water by spraying was performed.

[Treatment B]

(B-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m$^2$.

(B-b) Desmutting Treatment Using Acidic Aqueous Solution (First Desmutting Treatment)

Next, a desmutting treatment was performed using an acidic aqueous solution. As the acidic aqueous solution used for the desmutting treatment, an aqueous solution having a sulfuric acid concentration of 150 g/L was used. The liquid temperature was 30° C. The desmutting treatment was performed for 3 seconds by spraying the acidic aqueous solution to the aluminum plate using a spray. Thereafter, a washing treatment was performed.

(B-c) Electrochemical Roughening Treatment

Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm$^2$ in terms of the peak current value of the AC current waveform. Further, the total electric quantity of the aluminum plate used for the anodic reaction was 450 C/dm$^2$, and the electrolytic treatment was performed four times at energization intervals of 4 seconds for each of the electric quantity of 112.5 C/dm$^2$. A carbon electrode was used as a counter electrode of the aluminum plate. Thereafter, a washing treatment was performed.

(B-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. The amount of aluminum to be dissolved in the surface after being subjected to an electrochemical roughening treatment was 0.2 g/m$^2$. Thereafter, a washing treatment was performed.

(B-e) Desmutting Treatment Using Acidic Aqueous Solution

Next, a desmutting treatment was performed using an acidic aqueous solution. Specifically, the desmutting treatment was performed for 3 seconds by spraying the acidic aqueous solution to the aluminum plate using a spray. As the acidic aqueous solution used for the desmutting treatment, an aqueous solution having a sulfuric acid concentration of 170 g/L and an aluminum ion concentration of 5 g/L was used. The liquid temperature was 30° C.

(B-f) First Stage Anodization Treatment

A first stage anodization treatment was performed with an anodizing device using DC electrolysis and having a structure illustrated in FIG. 7. An anodized film having a predetermined coating amount was formed by performing an anodization treatment under conditions in the columns of "first anodization treatment" listed in Table 1.

(B-g) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at the temperature listed in Table 1 under a time condition listed in Table 1. Thereafter, washing with water by spraying was performed.

The details of the conditions for the anodization treatment and the conditions for the pore widening treatment of the aluminum support used in each example and each comparative example are listed in Table 1.

TABLE 1

| | | | | Conditions for anodization treatment | | | | | Conditions for pore widening treatment | |
|---|---|---|---|---|---|---|---|---|---|---|
| | | Treatment | Liquid type | Concentration of component (g/l) | Temperature of electrolytic solution (° C.) | Current density (A/dm²) | Treatment time (sec) | Film thickness of anodized film (μm) | Treatment temperature (° C.) | Time (sec) |
| Example | 1 | A | Phosphoric acid | 15 | 35 | 2 | 140 | 0.7 | 20 | 4 |
| | 2 | A | Phosphoric acid | 15 | 35 | 1 | 300 | 0.75 | 20 | 2 |
| | 3 | A | Phosphoric acid | 15 | 35 | 10 | 40 | 1 | 30 | 8 |
| | 4 | A | Phosphoric acid | 15 | 35 | 3 | 133 | 1 | 40 | 10 |
| | 5 | A | Phosphoric acid | 15 | 35 | 4.5 | 133 | 1.5 | 40 | 5 |
| | 6 | B | Phosphoric acid | 15 | 35 | 3 | 200 | 1.5 | 20 | 1 |
| | 7 | B | Phosphoric acid | 15 | 35 | 5 | 64 | 0.8 | 40 | 15 |
| | 8 | B | Phosphoric acid | 15 | 35 | 0.5 | 640 | 0.8 | 30 | 6 |
| | 9 | A | Phosphoric acid | 15 | 35 | 3 | 80 | 0.6 | 20 | 4 |
| | 10 | A | Phosphoric acid | 15 | 35 | 1.5 | 160 | 0.6 | 20 | 2 |
| | 11 | A | Phosphoric acid | 15 | 35 | 15 | 27 | 1 | 30 | 8 |
| | 12 | B | Phosphoric acid | 15 | 35 | 4.5 | 89 | 1 | 40 | 10 |
| | 13 | B | Phosphoric acid | 15 | 35 | 15 | 40 | 1.5 | 40 | 5 |
| | 14 | B | Phosphoric acid | 15 | 35 | 4.5 | 133 | 1.5 | 20 | 1 |
| | 15 | A | Phosphoric acid | 15 | 35 | 3 | 133 | 1 | 40 | 10 |
| | 16 | A | Phosphoric acid | 15 | 35 | 4.5 | 133 | 1.5 | 40 | 5 |
| | 17 | B | Phosphoric acid | 15 | 35 | 3 | 200 | 1.5 | 20 | 1 |
| | 18 | A | Phosphoric acid | 5 | 35 | 10 | 40 | 1 | 30 | 8 |
| | 19 | A | Phosphoric acid | 5 | 35 | 15 | 27 | 1 | 30 | 8 |
| | 20 | A | Phosphoric acid | 0.1 | 35 | 10 | 40 | 1 | 30 | 8 |
| | 21 | A | Phosphoric acid | 0.01 | 35 | 15 | 27 | 1 | 30 | 8 |
| | 22 | A | Phosphoric acid | 1 | 35 | 15 | 27 | 1 | — | — |
| Comparative Example | 1 | A | Phosphoric acid | 15 | 35 | 0.1 | 2000 | 0.5 | 50 | 4 |
| | 2 | A | Phosphoric acid | 15 | 35 | 0.2 | 1000 | 0.5 | 50 | 4 |
| | 3 | A | Phosphoric acid | 15 | 35 | 3.5 | 114 | 1 | 50 | 4 |
| | 4 | A | Phosphoric acid | 15 | 35 | 4 | 100 | 1 | 50 | 4 |
| | 5 | A | Phosphoric acid | 15 | 35 | 0.2 | 3000 | 1.5 | 50 | 8 |
| | 6 | B | Phosphoric acid | 15 | 35 | 0.15 | 4000 | 1.5 | 50 | 20 |
| | 7 | B | Phosphoric acid | 15 | 35 | 4 | 10 | 0.1 | 50 | 17 |
| | 8 | B | Phosphoric acid | 15 | 35 | 0.3 | 133 | 0.1 | 50 | 18 |
| | 9 | A | Phosphoric acid | 15 | 35 | 0.22 | 909 | 0.5 | 50 | 4 |
| | 10 | A | Phosphoric acid | 15 | 35 | 0.35 | 571 | 0.5 | 50 | 4 |
| | 11 | A | Phosphoric acid | 15 | 35 | 4 | 100 | 1 | 50 | 4 |
| | 12 | B | Phosphoric acid | 15 | 35 | 0.2 | 2000 | 1 | 50 | 8 |

TABLE 1-continued

| | | | Conditions for anodization treatment | | | | | Conditions for pore widening treatment | |
|---|---|---|---|---|---|---|---|---|---|
| | Treatment | Liquid type | Concentration of component (g/l) | Temperature of electrolytic solution (°C.) | Current density (A/dm²) | Treatment time (sec) | Film thickness of anodized film (μm) | Treatment temperature (°C.) | Time (sec) |
| 13 | B | Phosphoric acid | 15 | 35 | 0.15 | 4000 | 1.5 | 50 | 20 |
| 14 | B | Phosphoric acid | 15 | 35 | 4 | 150 | 1.5 | 50 | 17 |

The characteristics of the aluminum support obtained in each example and each comparative example are listed in Table 2.

In Table 2, the average pore diameter of micropores in the surface of the anodized film is listed in the columns of the "average pore diameter (μm)", the average maximum diameter of micropores inside the anodized film is listed in the columns of the "average maximum diameter (μm)", the average value A of the thicknesses of the surface opening portions is listed in the columns of the "thickness A (nm)", the average value B of the thicknesses of the internal maximum diameter portions is listed in the columns of the "thickness B (nm)", the thickness C of micropores from the deepest portion to the aluminum base is listed in the columns of the "thickness C (nm)", the value of the thickness B/the thickness A is listed in the columns of the "B/A", the average value of the depths of the large-diameter pores from the surface of the anodized film to the bottom thereof is listed in the columns of the "average value (nm) of the depths of large-diameter pores", the value of the brightness L* in the L*a*b* color system of the surface of the anodized film on the side of the image recording layer is listed in the columns of the "brightness L*", the value of the steepness a45 representing an area ratio of a portion having an inclining degree of 45° or greater obtained by extracting a component with a wavelength of 0.2 μm to 2 μm in the frequency distribution based on fast Fourier transformation is listed in the columns of the "steepness a45(%)", the void volume of the anodized film is listed in the columns of the "void volume (%)", and the density of micropores in the anodized film is listed in the "density of micropores (pcs/mm²)".

TABLE 2

| | | Average pore diameter (μm) | Average maximum diameter (μm) | Thickness A (nm) | Thickness B (nm) | Thickness C (nm) | B/A | Average value of depths of large-diameter pores (nm) | Brightness L* | Steepness a45 (%) | Void volume (%) | Density of micropores (pcs/μm²) |
|---|---|---|---|---|---|---|---|---|---|---|---|---|
| Example | 1 | 0.015 | 0.04 | 194 | 506 | 4 | 2.6 | 700 | 71 | 18 | 20 | 250 |
| | 2 | 0.01 | 0.06 | 188 | 563 | 6 | 3 | 750 | 73 | 30 | 23 | 600 |
| | 3 | 0.03 | 0.07 | 48 | 952 | 7 | 20 | 1000 | 75 | 30 | 30 | 1500 |
| | 4 | 0.022 | 0.1 | 91 | 909 | 10 | 10 | 1000 | 73 | 15 | 30 | 2000 |
| | 5 | 0.024 | 0.15 | 125 | 1375 | 15 | 11 | 1500 | 76 | 16 | 25 | 3000 |
| | 6 | 0.011 | 0.2 | 100 | 1400 | 20 | 14 | 1500 | 81 | 20 | 20 | 3200 |
| | 7 | 0.028 | 0.25 | 133 | 667 | 25 | 5 | 800 | 85 | 22 | 15 | 4500 |
| | 8 | 0.002 | 0.3 | 100 | 700 | 30 | 7 | 800 | 83 | 23 | 18 | 1500 |
| | 9 | 0.015 | 0.1 | 26 | 574 | 10 | 22 | 600 | 78 | 27 | 25 | 5000 |
| | 10 | 0.01 | 0.15 | 32 | 568 | 15 | 18 | 600 | 75 | 19 | 29 | 2500 |
| | 11 | 0.03 | 0.2 | 48 | 952 | 20 | 20 | 1000 | 77 | 21 | 35 | 3200 |
| | 12 | 0.022 | 0.25 | 91 | 909 | 25 | 10 | 1000 | 76 | 26 | 19 | 4200 |
| | 13 | 0.024 | 0.3 | 125 | 1375 | 30 | 11 | 1500 | 73 | 25 | 20 | 3300 |
| | 14 | 0.011 | 0.05 | 100 | 1400 | 5 | 14 | 1500 | 74 | 24 | 26 | 1600 |
| | 15 | 0.022 | 0.1 | 91 | 909 | 10 | 10 | 1000 | 73 | 15 | 30 | 2000 |
| | 16 | 0.024 | 0.15 | 125 | 1375 | 15 | 11 | 1500 | 76 | 16 | 25 | 3000 |
| | 17 | 0.011 | 0.2 | 100 | 1400 | 20 | 14 | 1500 | 81 | 20 | 20 | 3200 |
| | 18 | 0.07 | 0.1 | 48 | 952 | 7 | 20 | 1000 | 76 | 30 | 31 | 1200 |
| | 19 | 0.07 | 0.3 | 48 | 952 | 20 | 20 | 1000 | 78 | 21 | 36 | 2900 |
| | 20 | 0.09 | 0.13 | 48 | 952 | 7 | 20 | 1000 | 77 | 30 | 31 | 800 |
| | 21 | 0.11 | 0.16 | 48 | 952 | 7 | 20 | 1000 | 78 | 30 | 32 | 600 |
| | 22 | 0.05 | 0.25 | 48 | 952 | 20 | 20 | 1000 | 76 | 21 | 34 | 2600 |
| Comparative Example | 1 | 0.05 | 0.01 | 250 | 250 | 1 | 1 | 500 | 71 | 18 | 20 | 250 |
| | 2 | 0.06 | 0.02 | 333 | 167 | 2 | 0.5 | 500 | 73 | 30 | 23 | 600 |
| | 3 | 0.07 | 0.35 | 20 | 980 | 35 | 50 | 1000 | 75 | 30 | 30 | 1500 |
| | 4 | 0.055 | 0.4 | 32 | 968 | 40 | 30 | 1000 | 73 | 15 | 30 | 2000 |
| | 5 | 0.1 | 0.02 | 45 | 1455 | 2 | 32 | 1500 | 76 | 16 | 25 | 3000 |
| | 6 | 0.9 | 0.015 | 36 | 1464 | 1.5 | 41 | 1500 | 81 | 20 | 20 | 3200 |
| | 7 | 0.75 | 0.4 | 33 | 67 | 40 | 2 | 100 | 85 | 22 | 15 | 4500 |
| | 8 | 0.8 | 0.03 | 3 | 97 | 3 | 29 | 100 | 83 | 23 | 18 | 1500 |
| | 9 | 0.06 | 0.022 | 17 | 483 | 2.2 | 28.5 | 500 | 78 | 27 | 25 | 5000 |
| | 10 | 0.055 | 0.035 | 147 | 353 | 3.5 | 2.4 | 500 | 75 | 19 | 29 | 2500 |
| | 11 | 0.055 | 0.4 | 303 | 697 | 40 | 2.3 | 1000 | 77 | 21 | 35 | 3200 |
| | 12 | 0.1 | 0.02 | 30 | 970 | 2 | 32 | 1000 | 76 | 26 | 19 | 4200 |
| | 13 | 0.9 | 0.015 | 36 | 1464 | 1.5 | 41 | 1500 | 73 | 25 | 20 | 3300 |
| | 14 | 0.75 | 0.4 | 500 | 1000 | 40 | 2 | 1500 | 74 | 24 | 26 | 1600 |

<Formation of Undercoat Layer>

The support was bar-coated with an undercoat liquid (1) with the following composition and dried in an oven at 100° C. for 30 seconds to form an undercoat layer having a drying coating amount of 20 g/m².

[Undercoat Liquid (1)]
Undercoat compound 1 shown below: 0.18 parts
Methanol: 55.24 parts
Distilled water: 6.15 parts —Synthesis of Undercoat Compound 1—

<<Purification of monomer M-1>>

420 parts of Light Ester P-1M (2-methacryloyloxyethyl acid phosphate, manufactured by KYOEISHA CHEMICAL CO., LTD.), 1050 parts of diethylene glycol dibutyl ether, and 1050 parts of distilled water were added to a separatory funnel, and the solution was vigorously stirred and then allowed to stand. The upper layer was disposed of, 1050 parts of diethylene glycol dibutyl ether was added to the separatory funnel, and the solution was vigorously stirred and then allowed to stand. The upper layer was disposed of, thereby obtaining 1300 parts of an aqueous solution (10.5% by mass in terms of solid content) containing a monomer M-1.

<<Synthesis of Undercoat Compound 1>>

53.73 parts of distilled water and 3.66 parts of the following monomer M-2 were added to a three-neck flask, and the solution was heated to 55° C. in a nitrogen atmosphere. Next, the following dripping solution 1 was added dropwise thereto for 2 hours, the solution was stirred for 30 minutes, 0.386 parts of VA-046B (manufactured by Wako Pure Chemical Industries, Ltd.) was added thereto, and the solution was heated to 80° C. and stirred for 1.5 hours. The temperature of the reaction solution was returned to room temperature (25° C.), a 30 mass % sodium hydroxide aqueous solution was added thereto, the pH thereof was adjusted to 8.0, and 0.005 parts of 4-hydroxy-2,2,6,6-tetramethylpiperidine-1-oxyl (4-OH-TEMPO) was added thereto. By performing the above-described operation, 180 parts of an aqueous solution containing the undercoat compound 1 was obtained. The weight-average molecular weight (Mw) in terms of polyethylene glycol according to the gel permeation chromatography (GPC) method was 170000.

Monomer M-2

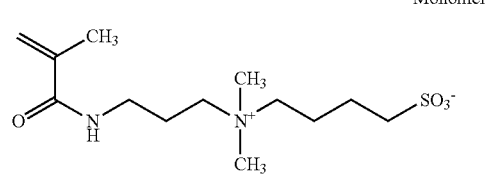

<<Dripping Solution 1>>
Monomer M-1 aqueous solution described above: 87.59 parts
Monomer M-2 described above: 14.63 parts
VA-046B (2,2'-azobis[2-(2-imidazolin-2-yl)propane]disulfate dehydrate, manufactured by Wako Pure Chemical Industries, Ltd.): 0.386 parts
Distilled water: 20.95 parts <Formation of Image Recording Layer>

An image recording layer was formed by bar-coating the aluminum support on which the undercoat layer was formed with the image recording layer coating solution (1) having the following composition or the image recording layer coating solution (2) having the following composition, drying the solution in an oven at 100° C. for 60 seconds, and setting the drying coating amount thereof to be the same as the amount obtained by subtracting the coating amount (20 mg/m²) of the undercoat layer and the coating amount (0.1 g/m²) of the overcoat layer as necessary from the description of "the total coating amount (g/m²) of all layers" in Table 3.

In each example, the image recording layer coating solution (1) or the image recording layer coating solution (2) which had been used is listed as (1) or (2) in the columns of the image recording layer coating solution in Table 3.

[Image Recording Layer Coating Solution (1)]
Polymerizable compound 1*[1]: 0.325 parts
Graft copolymer 1*[2]: 0.060 parts
Graft copolymer 2*[3]: 0.198 parts
Mercapto-3-triazole*[4]: 0.180 parts
Irgacure 250*[5]: 0.032 parts
Infrared absorbing agent 1 (the following structure): 0.007 parts
Sodium tetraphenylborate (the following structure): 0.04 parts
Klucel 99M*[6]: 0.007 parts
Byk 336*[7]: 0.015 parts
n-Propanol: 7.470 parts
Water: 1.868 parts
Black-15 (acid color former 1 shown below): 0.041 parts

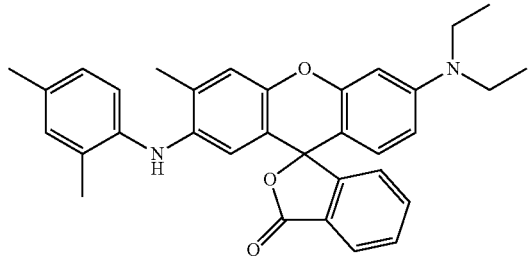

Chemical Formula: $C_{33}H_{32}N_2O_3$
Molecular Weight: 504.63
Acid color former 1

—Synthesis of Graft Copolymer 2—

*1: Dipentaerythritol hexaacrylate (manufactured by Shin-Nakamura Chemical Co., Ltd.)

*2: The graft copolymer 1 is a polymer grafted by poly(oxy-1,2-ethanediyl), α-(2-methyl-1-oxo-2-propenyl)-co-methoxy, and ethenylbenzene and is a dispersion containing 25% by mass of this polymer in a solvent containing n-propanol and water at a mass ratio of 80:20.

*3: The graft copolymer 2 is a polymer particle of a graft copolymer containing poly(ethylene glycol)methyl ether methacrylate, styrene, and acrylonitrile at a ratio of 10:9:81 and is a dispersion containing 24% by mass of the polymer particles in a solvent containing n-propanol and water at a mass ratio of 80:20. The volume average particle diameter is 193 nm.

*4: The mercapto-3-triazole indicates mercapto-3-triazole-1H,2,4, which is available from PCAS company (France).

*5: Irgacure 250 is an iodonium salt which is available from Ciba Specialty Chemicals Corporation as a 75% propylene carbonate solution and contains iodonium and (4-methylphenyl)[4-(2-methylpropyl)phenyl], -hexafluorophosphate.

*6: Klucel 99M is a hydroxypropyl cellulose thickener used as a 1% aqueous solution which is available from Hercules (Heverlee, Belgium).

*7: Byk 336 is a modified dimethyl polysiloxane copolymer contained in a 25 mass % xylene/methoxypropyl acetate solution, which is available from Byk Chemie GmbH.

A solution of 20 parts of polyethylene glycol methyl ether methacrylate (PEGMA) dissolved in a mixture of 50.5 parts of deionized water and 242.2 parts of n-propanol was added to a four-neck flask and slowly heated (to 73° C.) until being slightly refluxed in a $N_2$ atmosphere. A pre-mixture of styrene (9 parts), acrylonitrile (81 parts), and VAZO-64 (2,2-azobis(isobutyronitrile), 0.7 parts) was added thereto for 2 hours. After 6 hours, 0.5 parts of VAZO-64 was further added thereto. The solution was heated to a temperature of 80° C. Next, 0.7 parts of VAZO-64 was added for 12 hours. After the reaction for a total of 20 hours, the conversion rate into a graft copolymer was greater than 98% based on the measurement of the non-volatile percentage. The mass ratio of PEGMA, styrene, and acrylonitrile was 10:9:81, and the ratio of n-propanol and water was 80:20. The number average particle diameter of the polymer particles was 200 nm.

Here, the average particle diameter is a value obtained by imaging an electron micrograph of polymer particles, measuring a total of 5000 particles of equivalent circle diameters on the photograph, and averaging the measured values. The "equivalent circle diameter" is a diameter of a circle having the same area as the projected area on the photo of particles.

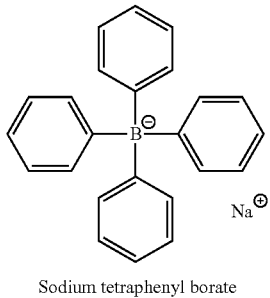 [SMILES: c1ccc([B-](c2ccccc2)(c2ccccc2)c2ccccc2)cc1 ; [Na+]]

Sodium tetraphenyl borate

Black-15 (acid color former 1 shown below): 0.041 parts

<Production of Polymer Particle (Hydrophobic Precursor) Aqueous Dispersion Liquid>

A nitrogen gas was introduced to a four-neck flask equipped with a stirrer, a thermometer, a dropping funnel, a nitrogen introduction pipe, and a reflux condenser, 350 parts of distilled water was added thereto while deoxidation was performed, and the flask was heated until the internal temperature was set to 80° C. 3.0 parts of sodium dodecyl sulfate was added thereto as a dispersant, 0.45 parts of ammonium persulfate was further added thereto as an initiator, and then a mixture of 22.0 parts of acrylonitrile, 20.0 parts of glycidyl methacrylate, and 20.0 parts of styrene was added dropwise thereto from the dropping funnel for 1 hour. After completion of the dropwise addition, the reaction was continued as it was for 5 hours so that unreacted monomers were removed by steam distillation. Thereafter, the reaction solution was cooled, the pH thereof was adjusted to 6 using ammonia water, and pure water was added so that the final non-volatile content became 15% by mass, thereby obtaining a polymer particle (hydrophobic precursor) aqueous dispersion liquid. The particle size distribution of the polymer particles had a maximum value at a particle diameter of 155 nm.

Here, the particle size distribution was acquired by imaging an electron micrograph of the polymer particles, measuring a total of 5000 particle diameters of fine particles on the photograph, dividing the interval from the maximum value of the obtained measured value of the particle diameter to 0 into the logarithmic scale of 50, and plotting the appearance frequency of each particle diameter. Further, the particle diameter of a spherical particle having the same particle area as the particle area on the photograph was set to the particle diameter, as non-spherical particles.

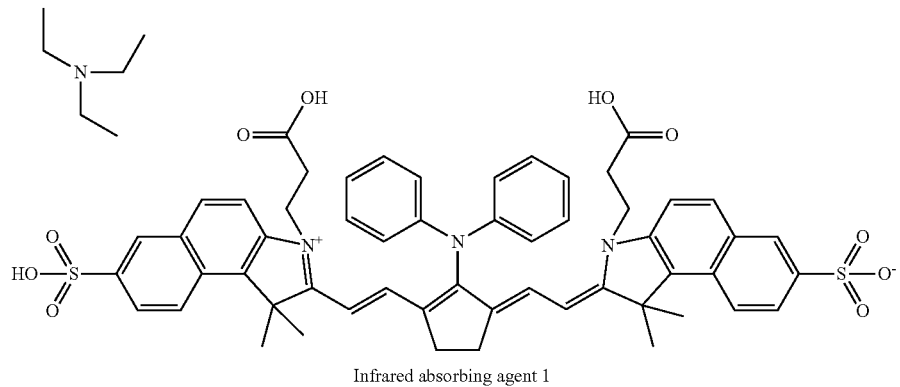

Infrared absorbing agent 1

[Image Recording Layer Coating Solution (2)]
Binder polymer (1) [the following structure]: 0.240 parts
Infrared absorbing agent (2) [the following structure]: 0.030 parts
Polymerization initiator (1) [the following structure]: 0.162 parts
Polymerizable compound (tris(acryloyloxyethyl)isocyanurate, NK Ester A-9300, manufactured by Shin-Nakamura Chemical Co., Ltd.): 0.192 parts
Tris(2-hydroxyethyl)isocyanurate: 0.062 parts
Benzyl-dimethyl-octylammonium and TsO (tosylic acid) salt: 0.018 parts
Ammonium group-containing polymer [the structure of the following reference numeral (15)]: 0.010 parts
Fluorine-based surfactant (1) [the following structure]: 0.008 parts
Methyl ethyl ketone: 1.091 parts
1-methoxy-2-propanol: 8.609 parts
Polymer particle (hydrophobic precursor) aqueous dispersion liquid: 5.065 parts

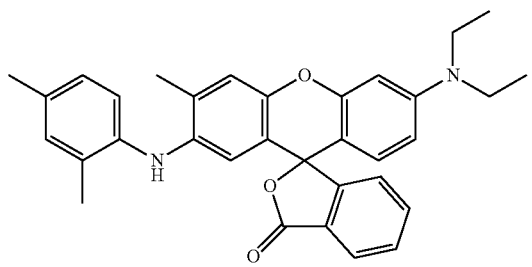

Chemical Formula: $C_{33}H_{32}N_2O_3$
Molecular Weight: 504.63
Acid color former 1

In the structural formula shown below, the numerical values of the parentheses representing the constitutional units of main chain skeletons represent the content (molar ratio) of each constitutional unit, the and numerical values of the parentheses of the ethylene glycol unit or the propylene glycol unit represent the repetition number of respective chains. Me represents a methyl group, and TsO⁻ represents a tosylate anion.

Binder polymer (1)

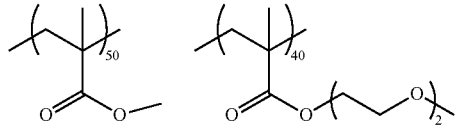

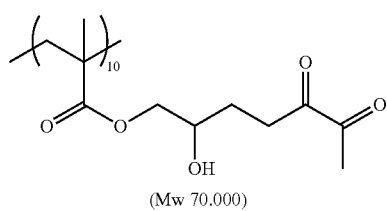

(Mw 70.000)

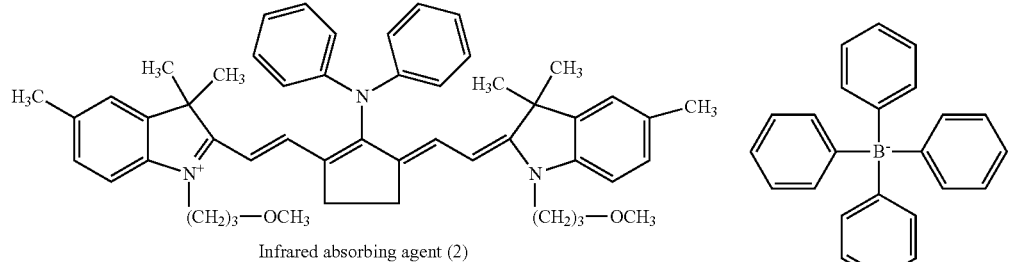

Infrared absorbing agent (2)

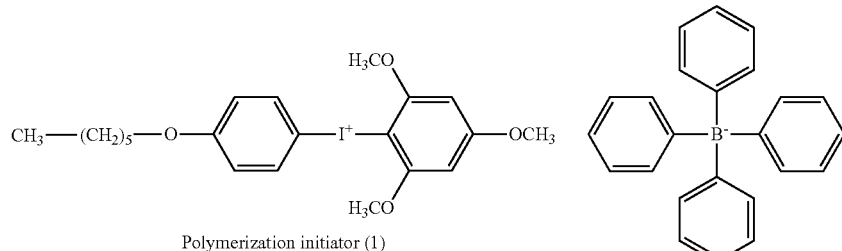

Polymerization initiator (1)

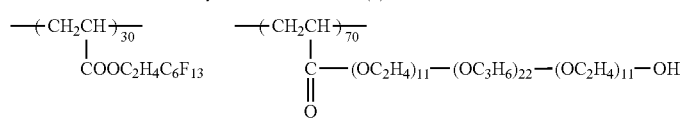

Fluorine-based surfactant (1)

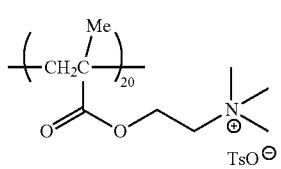

(15)

-continued

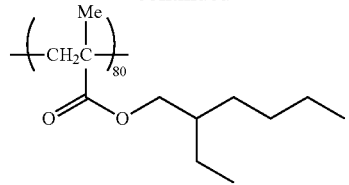

<Formation of Overcoat Layer>

The image recording layer was coated with an overcoat layer coating solution with the following composition and dried in an oven at 100° C. for 60 seconds to form an overcoat layer having a drying coating amount of 0.1 g/m², thereby obtaining a lithographic printing plate precursor.

The example in which the overcoat layer was formed is listed as "present" in the columns of the "overcoat layer" in Table 3.

[Overcoat Layer Coating Solution]

Methyl cellulose (METOLOSE SM04, manufactured by Shin-Etsu Chemical Co., Ltd.): 0.05 parts Surfactant (EMALEX 710, manufactured by NIHON EMULSION Co., Ltd.): 0.05 parts Water: amount which was set such that the total amount was 10 parts by mass <Evaluation>

[Evaluation of Appearance Failure]

After the obtained lithographic printing plate precursor was stored for 2 days or 4 days in an environment of 60° C. and a relative humidity of 60%, the number of parts discolored in a dot shape on the plate at an area of 0.025 m² was counted for each storage day using a loupe. A case where the number was 0 was evaluated as A, a case where the number was in a range of 1 to 9 was evaluated as B, and a case where the number was 10 or greater was evaluated as C.

The measurement results are listed in Table 1.

[Plate Inspectability]

The obtained lithographic printing plate precursor was exposed using Trendsetter 3244VX (manufactured by Creo Co., Ltd.) equipped with a water-cooling system 40 W infrared semiconductor laser under conditions of an output of 11.7 W, an external surface drum rotation speed of 250 rpm, a resolution of 2400 dpi (dot per inch, 1 inch is 2.54 cm). The level of easiness for inspecting the plate is noted using a difference ΔL* between the L* value of an exposed portion and the L* value of an unexposed portion based on the L* value (brightness) in the L*a*b* color system. In a case where the value of ΔL* increases, this means that the plate inspectability is excellent.

The measurement was performed according to a specular component excluded (SCE) system using a spectrophotometer CM2600d (manufactured by Konica Minolta Inc.) and operation software CM-S100W. According to the SCE system, since the specular reflection light is removed and only diffused light is measured, colors close to visual observation are evaluated. Therefore, this system correlates well with inspection of a plate performed by a person. The value of ΔL* was measured twice in total immediately after the exposures and after two hours at room temperature from the exposure.

The measurement results are listed in Table 1.

[Scratch Resistance]

The scratch resistance of the lithographic printing plate precursor was evaluated by performing a scratching test on the surface of the obtained support for a lithographic printing plate.

The scratching test was performed with a support having a weight of 100 g under conditions of a sapphire needle having a diameter of 0.4 mm and a needle movement speed of 10 cm/sec using a continuous weight type scratch strength tester (SB-53, manufactured by Shinto Scientific Co., Ltd.).

After the scratching test, the scratched portion was visually confirmed, and a support in which damage due to the needle did not reach the surface of the aluminum alloy plate (base) was considered to have excellent scratch resistance and evaluated as "A" and a support in which damage reached the surface thereof was evaluated as "B". Further, a support for a lithographic printing plate having a weight of 100 g and excellent scratch resistance is capable of suppressing transfer of damage to the image recording layer during winding and lamination at the time of formation of a lithographic printing plate precursor and suppressing stain occurring on a non-image area. Practically, it is preferable that this support is evaluated as "A".

[On-Press Developability]

The obtained lithographic printing plate precursors were exposed using Luxel PLATESETTER T-6000III (manufactured by Fujifilm Corporation) equipped with an infrared semiconductor laser under conditions of an external surface drum rotation speed of 1000 rpm, a laser output of 70%, and a resolution of 2,400 dpi. The exposure was carried out such that the exposed image had a solid image and a 50% halftone dot chart of a 20 μm dot frequency modulation (FM) screen.

The obtained exposed precursor was attached to the plate cylinder of a printing press LITHRONE26 (manufactured by KOMORI Corporation) without performing a development treatment. Dampening water and ink were supplied using a standard automatic printing start method for LITHRONE26 using dampening water, in which the volume ratio of Ecolity-2 (manufactured by Fujifilm Corporation) to tap water was 2:98, and Space Color Fusion G black ink black ink (manufactured by DIC Corporation) to perform on-press development, and then 500 sheets were printed on Tokubishi Art (manufactured by Mitsubishi Paper Mills, Ltd., ream weight of 76.5 kg) paper at a printing speed of 10000 sheets per hour.

The on-press development applied to the unexposed portion of the image recording layer on the printing press was completed, and the number of sheets of printed paper required until the ink was not transferred to the non-image area any more was measured as the on-press developability.

The measurement results are listed in Table 1.

[Printing Durability]

After the evaluation of the above-described tone reproducibility, printing was further performed. Since the image recording layer was gradually worn and thus ink receptivity was degraded along with an increase in number of printed sheets, the ink density on printed paper was decreased. In a printing plate exposed with the same exposure amount, the printing durability was evaluated based on the number of printed sheets (number X of printed sheets) at the time of a decrease in ink density (total light reflection density, measuring device eXact, manufactured by Videojet X-Rite K.K.) of a solid image area at a measurement wavelength range of 400 to 700 nm by 0.1 compared to the ink density at the time of starting the printing. The printing durability was evaluated based on the relative printing durability defined as follows using the lithographic printing plate precursor used in Comparative Example 1 as a reference (100). In a case where the value of the relative printing durability is high, this means that the printing durability is high. The evaluation results are listed in Table 3.

Relative printing durability=(number X of printed sheets in case of using target lithographic printing plate precursor)/(number X of printed sheets in case of using reference lithographic printing plate precursor)×100

TABLE 3

| | | Image recording layer coating solution | Overcoat layer | Total coating amount of all layers (g/m²) | Appearance failure Storage for 2 days | Appearance failure Storage for 4 days | Plate inspectability ΔL* Immediately after exposure | Plate inspectability ΔL* After 2 hours | Scratch resistance | Printing durability | On-press developability |
|---|---|---|---|---|---|---|---|---|---|---|---|
| Example | 1 | (1) | — | 2.1 | A | B | 3 | 2 | A | 150 | 10 |
| | 2 | (1) | — | 2.5 | A | B | 3 | 2 | A | 150 | 10 |
| | 3 | (1) | — | 1.5 | A | B | 3 | 2 | A | 150 | 10 |
| | 4 | (1) | — | 2.0 | A | B | 3 | 2 | A | 150 | 10 |
| | 5 | (1) | — | 1.0 | A | B | 3 | 2 | A | 150 | 10 |
| | 6 | (1) | — | 1.5 | A | B | 5 | 4 | A | 100 | 15 |
| | 7 | (1) | — | 2.6 | A | B | 5 | 4 | A | 100 | 15 |
| | 8 | (1) | — | 3.0 | A | B | 5 | 4 | A | 120 | 15 |
| | 9 | (2) | — | 2.1 | A | A | 3 | 2 | A | 150 | 10 |
| | 10 | (2) | — | 2.5 | A | A | 3 | 2 | A | 150 | 10 |

TABLE 3-continued

|  |  | Image recording layer coating solution | Overcoat layer | Total coating amount of all layers (g/m²) | Appearance failure Storage for 2 days | Storage for 4 days | Plate inspectability ΔL* Immediately after exposure | After 2 hours | Scratch resistance | Printing durability | On-press developability |
|---|---|---|---|---|---|---|---|---|---|---|---|
|  | 11 | (2) | — | 1.5 | A | A | 3 | 2 | A | 150 | 10 |
|  | 12 | (2) | — | 2.0 | A | A | 5 | 4 | A | 100 | 15 |
|  | 13 | (2) | — | 1.0 | A | A | 5 | 4 | A | 100 | 15 |
|  | 14 | (2) | — | 1.5 | A | A | 5 | 4 | A | 100 | 15 |
|  | 15 | (1) | Present | 2.2 | A | A | 5 | 4 | A | 160 | 10 |
|  | 16 | (1) | Present | 1.0 | A | A | 5 | 4 | A | 160 | 10 |
|  | 17 | (2) | Present | 1.5 | A | A | 5 | 4 | A | 120 | 10 |
|  | 18 | (1) | — | 1.5 | A | B | 3 | 2 | A | 160 | 10 |
|  | 19 | (1) | — | 1.5 | A | A | 3 | 2 | A | 160 | 10 |
|  | 20 | (1) | — | 1.5 | A | B | 3 | 2 | A | 170 | 10 |
|  | 21 | (1) | — | 1.5 | A | B | 4 | 3 | A | 175 | 10 |
|  | 22 | (1) | — | 1.5 | A | A | 3 | 2 | A | 150 | 10 |
| Comparative Example | 1 | (1) | — | 1.9 | C | C | 3 | 2 | B | 150 | 10 |
|  | 2 | (1) | — | 1.5 | C | C | 3 | 2 | B | 150 | 10 |
|  | 3 | (1) | — | 1.3 | C | C | 3 | 2 | B | 150 | 10 |
|  | 4 | (1) | — | 1.0 | C | C | 3 | 2 | B | 150 | 10 |
|  | 5 | (1) | — | 0.7 | C | C | 3 | 2 | B | 150 | 10 |
|  | 6 | (1) | — | 0.5 | B | C | 5 | 4 | B | 100 | 15 |
|  | 7 | (1) | — | 2.3 | B | C | 5 | 4 | B | 100 | 15 |
|  | 8 | (1) | — | 2.0 | B | C | 5 | 4 | B | 120 | 15 |
|  | 9 | (2) | — | 1.9 | C | C | 3 | 2 | B | 150 | 10 |
|  | 10 | (2) | — | 1.5 | C | C | 3 | 2 | B | 150 | 10 |
|  | 11 | (2) | — | 1.3 | C | C | 3 | 2 | B | 150 | 10 |
|  | 12 | (2) | — | 1.0 | B | C | 5 | 4 | B | 100 | 15 |
|  | 13 | (2) | — | 0.7 | B | C | 5 | 4 | B | 100 | 15 |
|  | 14 | (2) | — | 0.5 | B | C | 5 | 4 | B | 100 | 15 |

Examples 23 to 26

<Preparation of Aluminum Support>

An aluminum plate (aluminum alloy plate, material 1S) having a thickness of 0.3 mm was subjected to the following treatment C, thereby producing an aluminum support. Moreover, during all treatment steps, a washing treatment was performed, and liquid cutting was performed using a nip roller after the washing treatment.

[Treatment C]

(C-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m².

(C-b) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having a sulfuric acid concentration of 150 g/L was used. The liquid temperature was 30° C.

(C-c) Electrochemical Roughening Treatment Using Hydrochloric Acid Aqueous Solution Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm² in terms of the peak current value of the AC current waveform. Further, the total electric quantity of the aluminum plate used for the anodic reaction was 450 C/dm², and the electrolytic treatment was performed four times at energization intervals of 4 seconds for each of the electric quantity of 112.5 C/dm². A carbon electrode was used as a counter electrode of the aluminum plate. Thereafter, a washing treatment with water was performed.

(C-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. Thereafter, washing with water by spraying was performed. The amount of aluminum to be dissolved in the surface after being subjected to an electrochemical roughening treatment was 0.2 g/m².

(C-e) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, a waste liquid generated in the anodization treatment step (an aqueous solution having a sulfuric acid concentration of 170 g/L and an aluminum ion concentration of 5 g/L) was used. The liquid temperature was 30° C.

(C-f) First Stage Anodization Treatment

A first anodization treatment was performed with an anodizing device using DC electrolysis illustrated in FIG. 7. An anodized film having a predetermined coating amount was formed by performing an anodization treatment under conditions in the columns of "first anodization treatment" listed in Table 4.

(C-g) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at a temperature of 40° C. under a time condition listed in Table 4. Thereafter, washing with water by spraying was performed.

(C-h) Second Stage Anodization Treatment

A second stage anodization treatment was performed with an anodizing device using DC electrolysis and having a structure illustrated in FIG. 7. An anodized film having a predetermined coating amount was formed by performing an anodization treatment under conditions in the columns of "second anodization treatment" listed in Table 4.

TABLE 4

|  |  |  | Conditions for first anodization treatment | | | | | Conditions for pore widening treatment | |
| --- | --- | --- | --- | --- | --- | --- | --- | --- | --- |
|  | Treatment | Liquid type | Concentration of component (g/l) | Temperature of electrolytic solution (° C.) | Current density (A/dm²) | Treatment time (sec) | Film thickness of anodized film (μm) | Treatment temperature (° C.) | Time (sec) |
| Example 23 | C | Phosphoric acid | 15 | 35 | 3 | 20 | 0.15 | 20 | 1 |
| 24 | C | Phosphoric acid | 15 | 35 | 5 | 16 | 0.2 | 40 | 15 |
| 25 | C | Phosphoric acid | 5 | 35 | 15 | 8 | 0.3 | 30 | 2 |
| 26 | C | Phosphoric acid | 1 | 35 | 15 | 5 | 0.2 | — | — |

|  |  |  | Conditions for second anodization treatment | | | | | |
| --- | --- | --- | --- | --- | --- | --- | --- |
|  | Treatment | Liquid type of | Concentration component (g/l) | Temperature of electrolytic solution (° C.) | Current density (A/dm²) | Treatment time (sec) | Film thickness of anodized film (μm) | Film thickness of anodized film (μm) |
| Example 23 | C | Sulfuric acid | 170 | 50 | 13 | 8 | 0.5 | 0.6 |
| 24 | C | Sulfuric acid | 170 | 50 | 13 | 30 | 1.8 | 2.0 |
| 25 | C | Sulfuric acid | 170 | 50 | 13 | 32 | 1.9 | 2.2 |
| 26 | C | Sulfuric acid | 170 | 50 | 13 | 38 | 2.2 | 2.4 |

The characteristics of the aluminum support obtained in each example are listed in Table 5.

In Table 5, the average pore diameter of small-diameter pores is listed in the columns of the "average pore diameter of small-diameter pores (μm)" and the average value of the depths from the surface of large-diameter pores to the bottom of small-diameter pores is listed is listed in the columns of the "average value (nm) of the depths of small-diameter pores".

The description in other columns is the same as the description in the columns of Table 2.

TABLE 5

|  | Average pore diameter (μm) | Average maximum diameter (μm) | Thickness A (nm) | Thickness B (nm) | Thickness C (nm) | B/A | Average value of depths of large-diameter pores (nm) | Average pore diameter of small-diameter pores (μm) |
| --- | --- | --- | --- | --- | --- | --- | --- | --- |
| Example 23 | 0.01 | 0.2 | 10 | 140 | 13 | 14 | 150 | 0.008 |
| 24 | 0.03 | 0.25 | 33 | 167 | 13 | 5 | 200 | 0.008 |
| 25 | 0.07 | 0.3 | 14 | 286 | 13 | 20 | 300 | 0.008 |
| 26 | 0.05 | 0.25 | 10 | 190 | 13 | 20 | 200 | 0.008 |

|  | Average value of depths of small-diameter pores (nm) | Brightness L* | Steepness a45 (%) | Void volume (%) | Density of micropores (pcs/μm²) |
| --- | --- | --- | --- | --- | --- |
| Example 23 | 458 | 81 | 20 | 20 | 3200 |
| 24 | 1782 | 85 | 22 | 15 | 4500 |

TABLE 5-continued

| | | | | | |
|---|---|---|---|---|---|
| 25 | 1900 | 78 | 21 | 36 | 2900 |
| 26 | 2228 | 76 | 21 | 34 | 2600 |

An undercoat layer and an image recording layer were formed on the support obtained in each example according to the same method as in Example 1, and the appearance failure, plate inspectability, scratch resistance, on-press developability, and printing durability were evaluated in the same manner as in Example 1. The evaluation results are listed in Table 6.

TABLE 6

| | Image recording layer coating solution | Overcoat layer | Total coating amount of all layers (g/m$^2$) | Appearance failure | | Plate inspectability ΔL* | | Scratch resistance | Printing durability | On-press developability |
|---|---|---|---|---|---|---|---|---|---|---|
| | | | | Storage for 2 days | Storage for 4 days | Immediately after exposure | After 2 hours | | | |
| Example 23 | (1) | — | 1.5 | A | B | 5 | 4 | A | 100 | 15 |
| 24 | (1) | — | 2.6 | A | B | 5 | 4 | A | 100 | 15 |
| 25 | (1) | — | 1.5 | A | A | 3 | 2 | A | 160 | 10 |
| 26 | (1) | — | 1.5 | A | A | 3 | 2 | A | 150 | 10 |

The disclosure of JP2017-190837 filed on Sep. 29, 2017 and the disclosure of JP2018-069152 filed on Mar. 30, 2018 are incorporated in the present specification by reference.

All documents, patent applications, and technical standards described in the present specification are incorporated herein by reference to the same extent as in a case of being specifically and individually noted that individual documents, patent applications, and technical standards are incorporated by reference.

EXPLANATION OF REFERENCES

1: aluminum plate
2, 4: roller-like brushes
3: polishing slurry liquid
5, 6, 7, 8: support roller
10: aluminum support
12: aluminum base
20: anodized film
30: micropore
32: surface opening portion
34: internal maximum diameter portion
36: opening portion
42: average pore diameter in surface of anodized film
44: average maximum diameter of surface opening portion
46: average maximum diameter of internal maximum diameter portion
50: main electrolytic cell
52: radial drum roller
51: AC power source
53a, 53b: main pole
55: electrolytic solution
54: electrolytic solution supply port
56: slit
57: electrolytic solution passage
60: auxiliary anode cell
58: auxiliary anode
122: maximum diameter of large-diameter pores inside anodized film
124: average pore diameter of micropores in surface of anodized film
126: pore diameter of small-diameter pores in communication position
130: large-diameter pore
132: small-diameter pore
610: anodization treatment device
616: aluminum plate
618: electrolytic solution
612: power supply tank
614: electrolytic treatment tank
616: aluminum plate
620: power supply electrode
622: roller
624: nip roller
626: electrolytic solution
628: roller
630: electrolytic electrode
634: DC power source
W: aluminum plate
A: thickness of surface opening portion
B: thickness of internal maximum portion
C: thickness from deepest portion of micropore to aluminum base
D: depth of large-diameter pore from surface of anodized film to bottom
E: depth of small-diameter pore from communication position to bottom
F: thickness of anodized film
X: thickness of entire anodized film 20
AA: current of aluminum plate during anodic reaction
AC: current of aluminum plate during cathodic reaction
S: orientation of liquid supply
V: electrolytic solution discharge port

What is claimed is:
1. A lithographic printing plate precursor comprising:
an aluminum support; and
an image recording layer on the aluminum support,
wherein the aluminum support includes an anodized film on a surface of the image recording layer side,
the anodized film has micropores extending in a depth direction from the surface of the anodized film on the image recording layer side,
an average pore diameter of the micropores in the surface of the anodized film is greater than 0 μm and 0.03 μm or less, an average maximum diameter of the micropores inside the anodized film is in a range of 0.04 µm to 0.30 µm, an average value A nm of thicknesses of surface opening portions starting from the surface of the anodized film and having a pore diameter inside the anodized film of greater than 0 µm and 0.03 µm or less and an average value B nm of thicknesses of internal maximum diameter portions in which pore diameters of the micropores inside the anodized film are in a range of 0.04 µm to 0.30 µm satisfy a relationship of $2.5 \leq B/A \leq 28.0$, the average value B of thicknesses of the internal maximum diameter portions is in a range of 500 nm to 2800 nm, and the image recording layer contains an acid color former.

2. The lithographic printing plate precursor according to claim 1, wherein the average value A of the thicknesses of the surface opening portions is in a range of 10 nm to 200 nm.

3. A lithographic printing plate precursor comprising:

an aluminum support; and an image recording layer on the aluminum support, wherein the aluminum support includes an anodized film on a surface of the image recording layer side, the anodized film has micropores extending in a depth direction from the surface of the anodized film on the image recording layer side, the micropores include at least large-diameter pores whose maximum diameter inside the anodized film is in a range of 0.01 um to 0.30 um, an average pore diameter of the micropores in the surface of the anodized film is 90% or less of the maximum diameter of the micropores inside the anodized film, a thickness of the anodized film is in a range of 550 nm to 2850 nm, and the image recording layer contains an acid color former.

4. The lithographic printing plate precursor according to claim 3, wherein the micropores are micropores which further include small-diameter pores communicating with a bottom of the large-diameter pores, extending in the depth direction from a communication position, and having an average pore diameter of 0.01 µm or less and in which the pore diameters of the small-diameter pores in the communication position are smaller than the pore diameters of the large-diameter pores in the communication position.

5. The lithographic printing plate precursor according to claim 3, wherein an average value of depths of the large-diameter pores to the bottom from the surface of the anodized film is in a range of 5 nm to 400 nm.

6. The lithographic printing plate precursor according to claim 3, wherein the acid color former is a leuco dye.

7. The lithographic printing plate precursor according to claim 3, wherein the image recording layer further contains an acid generator.

8. The lithographic printing plate precursor according to claim 7, wherein the acid generator contains an organic borate compound.

9. The lithographic printing plate precursor according to claim 3, wherein a value of a brightness L* in an L*a*b* color system of the surface of the anodized film on the image recording layer side is in a range of 70 to 100.

10. The lithographic printing plate precursor according to claim 3, wherein a value of a brightness L* in an L*a*b* color system of the surface of the anodized film on the image recording layer side is in a range of 72 to 90.

11. The lithographic printing plate precursor according to claim 3, wherein a steepness a45 representing an area ratio of a portion having an inclining degree of 45° or greater obtained by extracting a component with a wavelength of 0.2 µm to 2 in the surface of the anodized film on the image recording layer side in a frequency distribution based on fast Fourier transformation of three-dimensional data obtained by performing measurement using an atomic force microscope is 30% or less.

12. The lithographic printing plate precursor according to claim 3, wherein an amount of the image recording layer is in a range of 0.5 g/m² to 2.5 g/m².

13. The lithographic printing plate precursor according to claim 3, wherein a thickness X µm of the anodized film and a total amount Y g/m² of all layers formed on the aluminum support satisfy a relationship of Expression 1

$$Y \geq -1.19X + 2.6 \qquad \text{Expression 1.}$$

14. The lithographic printing plate precursor according to claim 3, wherein the image recording layer contains thermoplastic polymer particles, and the thermoplastic polymer particles are formed of a copolymer of a styrene-(meth)acrylonitrile-poly(ethylene glycol)monoalkyl ether (meth)acrylate compound.

15. The lithographic printing plate precursor according to claim 3, wherein an overcoat layer containing a water-soluble polymer is provided on the image recording layer.

16. The lithographic printing plate precursor according to claim 15, wherein the overcoat layer contains hydroxyalkyl cellulose.

17. The lithographic printing plate precursor according to claim 3, which is a lithographic printing plate precursor for on-press development.

18. A method of preparing a lithographic printing plate, comprising:

a step of imagewise-exposing the lithographic printing plate precursor according to claim 3; and a step of supplying at least any of printing ink or dampening water and removing an image recording layer in a non-image area on a printing press.

19. A lithographic printing method comprising:

a step of imagewise-exposing the lithographic printing plate precursor according to claim 3;

a step of supplying at least any of printing ink or dampening water and removing a non-image area of an image recording layer on a printing press to prepare a lithographic printing plate; and a step of performing printing using the obtained lithographic printing plate.

* * * * *